United States Patent
Olejniczak et al.

(10) Patent No.: US 6,462,976 B1
(45) Date of Patent: Oct. 8, 2002

(54) CONVERSION OF ELECTRICAL ENERGY FROM ONE FORM TO ANOTHER, AND ITS MANAGEMENT THROUGH MULTICHIP MODULE STRUCTURES

(75) Inventors: Kraig J. Olejniczak; Keith C. Burgers; Simon S. Ang, all of Fayetteville; Errol V Porter, West Fork, all of AR (US)

(73) Assignee: University of Arkansas, Little Rock, AR (US)

( * ) Notice: Subject to any disclaimer, the term of this patent is extended or adjusted under 35 U.S.C. 154(b) by 0 days.

(21) Appl. No.: 09/517,197

(22) Filed: Mar. 2, 2000

Related U.S. Application Data

(63) Continuation-in-part of application No. 09/027,102, filed on Feb. 20, 1998, now abandoned.
(60) Provisional application No. 60/039,682, filed on Feb. 21, 1997, and provisional application No. 60/039,681, filed on Feb. 21, 1997.

(51) Int. Cl.$^7$ ............................................... H02M 1/00
(52) U.S. Cl. ...................................... 363/147; 361/794
(58) Field of Search .......................... 363/147; 361/794, 361/761, 749, 768

(56) References Cited

U.S. PATENT DOCUMENTS

| | | | |
|---|---|---|---|
| 4,228,493 A | 10/1980 | de Sartre et al. | 363/56 |
| 4,577,214 A | 3/1986 | Schaper | 357/74 |
| 4,675,717 A | 6/1987 | Herrero et al. | 357/71 |
| 4,761,600 A * | 8/1988 | D'Atre et al. | 318/759 |
| 4,779,031 A | 10/1988 | Arends et al. | 318/565 |
| 4,806,844 A | 2/1989 | Claydon et al. | 323/311 |
| 4,819,147 A | 4/1989 | Bingham | 363/127 |
| 4,891,242 A | 1/1990 | Ito et al. | 427/53.1 |
| 4,961,806 A | 10/1990 | Gerrie et al. | 156/252 |
| 4,972,470 A | 11/1990 | Farago | 380/3 |
| 5,053,920 A | 10/1991 | Staffiere et al. | 361/383 |
| 5,119,286 A | 6/1992 | Huss et al. | 363/147 |
| 5,159,427 A | 10/1992 | Ogura et al. | 357/48 |
| 5,253,156 A | 10/1993 | Sakurai et al. | 363/98 |
| 5,272,428 A * | 12/1993 | Spiegel et al. | 318/803 |
| 5,313,150 A | 5/1994 | Arakawa et al. | 318/768 |
| 5,313,381 A | 5/1994 | Balakrishnan | 363/147 |

(List continued on next page.)

*Primary Examiner*—Peter S. Wong
*Assistant Examiner*—Bao Q. Vu
(74) *Attorney, Agent, or Firm*—Head, Johnson & Kachigan; Trent Keisling

(57) ABSTRACT

The design and fabrication of a highly integrated, intelligent integral horsepower, three-phase induction motor drive is based on multichip module (MCM) technology. A conventional three-phase induction motor is transformed into a stand-alone variable-speed drive by way of MCM technology. This solid-state controller-known as a multichip power module (MCPM)-uses known good die (KGD) to obtain minimal footprint, volume, and mass, while maximizing efficiency, reliability, and manufacturability. This is done by integrating the low-power control and high-power sections onto a single substrate. In accordance with one embodiment of the present invention, an integrated circuit assembly formed on a single substrate is capable of transforming and controlling AC power input to DC power output responsive to input signals. In accordance with another embodiment, an integrated circuit assembly on a single substrate is capable of receiving direct current power and controlling it and transforming it to alternating current power in single phase or multiphase form having variable magnitude and/or variable frequency. In accordance with a further embodiment, an integrated circuit assembly on a single substrate is capable of receiving alternating current power and controlling it and transforming it to alternating current power in single phase or multiphase form having variable magnitude and/or variable frequency.

6 Claims, 17 Drawing Sheets

U.S. PATENT DOCUMENTS

| | | | |
|---|---|---|---|
| 5,345,154 A | * 9/1994 | King | 318/49 |
| 5,355,301 A | 10/1994 | Saito et al. | 363/147 |
| 5,365,405 A | 11/1994 | Hoenlein et al. | 361/766 |
| 5,383,140 A | 1/1995 | Nanno et al. | 364/708.1 |
| 5,384,691 A | 1/1995 | Neugebauer et al. | 361/794 |
| 5,410,107 A | 4/1995 | Schaper | 174/255 |
| 5,412,558 A | 5/1995 | Sakurai et al. | 363/98 |
| 5,432,675 A | 7/1995 | Sorimachi et al. | 361/719 |
| 5,434,745 A | 7/1995 | Shokrgozar et al. | 361/735 |
| 5,436,540 A | * 7/1995 | Kumar | 318/375 |
| 5,452,182 A | 9/1995 | Eichelberger et al. | 361/749 |
| 5,488,542 A | 1/1996 | Ito | 361/793 |
| 5,495,394 A | 2/1996 | Kornfeld et al. | 361/764 |
| 5,532,512 A | 7/1996 | Fillion et al. | 257/686 |
| 5,544,017 A | 8/1996 | Beilin et al. | 361/790 |
| 5,589,743 A | * 12/1996 | King | 318/139 |
| 5,604,383 A | 2/1997 | Matsuzaki | 257/778 |
| 5,608,192 A | 3/1997 | Moriizumi et al. | 174/255 |
| 5,608,617 A | 3/1997 | Morrison et al. | 363/147 |
| 5,616,888 A | 4/1997 | McLaughlin et al. | 174/260 |
| 5,619,108 A | 4/1997 | Komurasaki et al. | 318/140 |
| 5,629,559 A | 5/1997 | Miyahara | 257/666 |
| 5,629,574 A | 5/1997 | Cognetti et al. | 310/71 |
| 5,629,575 A | 5/1997 | Cazal et al. | 310/91 |
| 5,634,267 A | 6/1997 | Farnworth et al. | 29/840 |
| 5,641,944 A | 6/1997 | Wieloch et al. | 174/252 |
| 5,747,982 A | 5/1998 | Dromgoole et al. | 323/902 |
| 5,864,478 A | 1/1999 | McCutchan et al. | 363/147 |

* cited by examiner

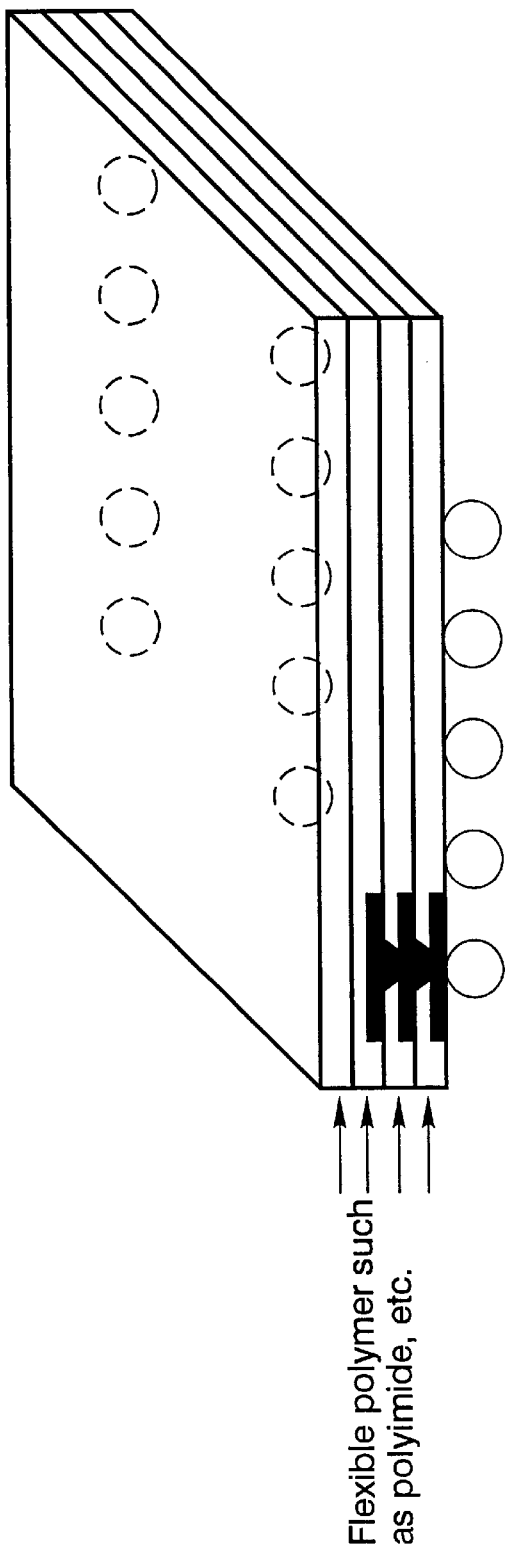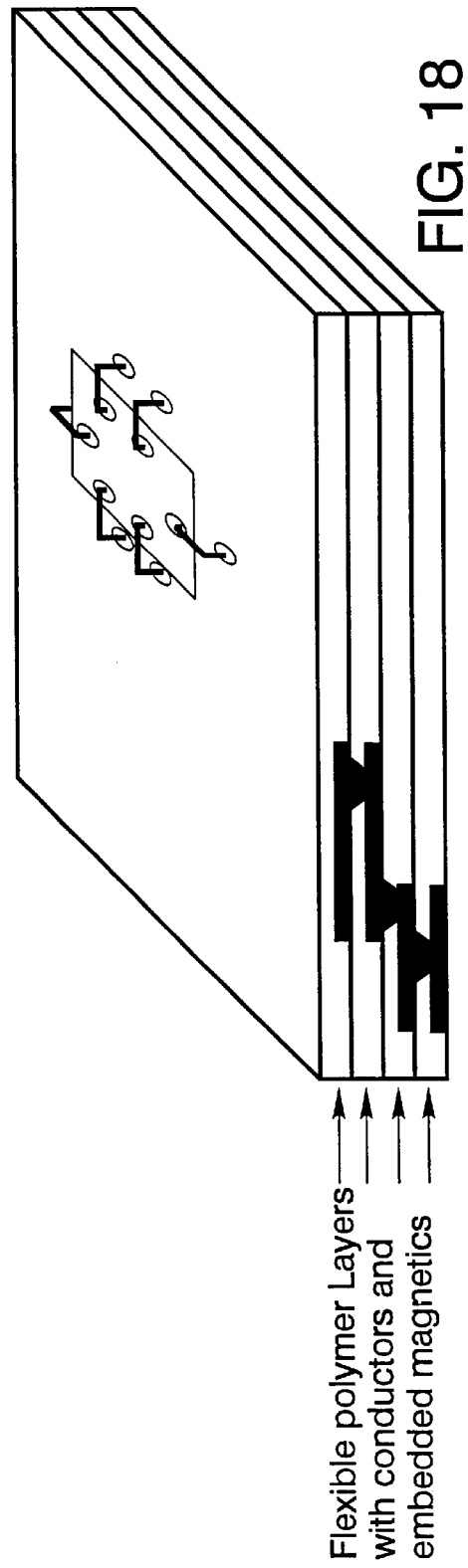

CONVERSION OF ELECTRICAL ENERGY FROM ONE FORM TO ANOTHER, AND ITS MANAGEMENT THROUGH MULTICHIP MODULE STRUCTURES

CROSS-REFERENCE TO RELATED APPLICATIONS

This application is a continuation-in-part of U.S. provisional patent application Ser. No. 60/039,682, filed Feb. 21, 1997, Ser. No. 60/039,681, filed Feb. 21, 1997, and Ser. No. 09/027,102, filed Feb. 20, 1998 now abandoned, all are hereby incorporated by reference.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

The present invention is directed to integrated circuits, power electronics, single substrate integrated circuits, and multichip module structures. More particularly, the invention is directed to the design and fabrication of a highly integrated, intelligent, integral horsepower, three-phase induction motor drive based on multichip module (MCM) technology. This solid-state controller-known as a multichip power module (MCPM)-uses known good die to obtain minimal footprint, volume, and mass, while maximizing efficiency, reliability, and manufacturability.

Power electronics encompasses the many applications of solid-state electronics to the control and conversion of electric power from one form to another; specifically, ac to ac, dc to dc, ac to dc, to dc, ac to dc, and dc to ac conversion as shown in FIG. 1. In most cases, the techniques used to convert energy from one form to another require the switching on and off of power semiconductor devices (PSDs). Low-power electronic circuits (relative to the power rating of the circuit they are controlling), consisting of integrated circuits (ICs) and discrete components, generate the required gating signals for these power devices. Analog control methodologies, implemented via discrete components, however, are steadily being replaced by digital control philosophies utilizing microcontrollers and digital signal processors (DSPs). With this increase in available computational power and the advent of faster switching devices, the control strategies available to meet the conversion specifications are widening the scope of power electronics applications. Within the last decade, the power electronics revolution has gained tremendous momentum. Within the next two to three decades, power electronics will shape and condition a large portion of the electric power processed in terrestrial and extraterrestrial power systems. The potential applications of power electronics are numerous, still in their infancy, and yet to be fully explored.

The use of solid-state electronics to replace electromechanical mechanisms in low-power consumer electronics has resulted in tremendous improvements in product performance, capability, and reliability. This can be attributed to rapid and novel advances in the semiconductor device and electronic packaging industries. Developments in high-power electronics packaging, driven by the military and industrial sectors emphasizing the transportation (e.g., next-generation shipboard systems and electric/electric-hybrid vehicles), aerospace (e.g., next-generation "fly-by-light, power-by-wire" jetliners), telecommunication (e.g., satellite power systems), and electric utility markets (e.g., inverter-based flexible ac transmission system controllers), has been recently initiated but is still considered to be in an embryonic stage. The main impetus for this effort is to enable development of common modular and integrated designs scalable to numerous applications which are constrained by reliability, mass, footprint, volume, manufacturing and cost considerations.

Hence, there is a need for an improved apparatus, system, device, component, or circuit and method for converting electrical energy from one form to another and/or its management through multichip module structures.

BRIEF SUMMARY OF THE INVENTION

The key to successfully implementing the above modular approach lies on the miniaturization and packaging of the power semiconductor devices with their associated peripheral circuits such as the PSD drivers, protection and diagnostic circuits, and the microcontroller- or DSP-based controller [1]. The controller and driver portions of an "intelligent power module" must provide, among other things, the following functions for a variable-speed induction motor drive: the pulsewidth modulation (PWM) signals for each of the six inverter switching elements (PWM signals for twelve PSDs if a controlled rectifier is used and 13 pwm signals if one also includes a regernerative braking resistor), bi-directional communications with the outside world, provide the necessary dead time between the upper and lower switches in each phase arm, monitor specified module operating conditions and shut down the inverter in the event of a fault, and provide floating drive capability for the high-side switching elements.

In accordance with at least one embodiment of the present invention, there is provided a new and unique process for building configurable power electronics building blocks. In accordance with the present invention, multichip module (MCM) technology for power electronics miniaturization and packaging is utilized. Further, processes and procedures developed at or in the University of Arkansas High Density Electronic Center (HiDEC) are used to produce single-substrate power electronic applications where hybrid, thick-film technology is the present state of the art Moreover, the present invention is directed to the use of multichip module technology for power electronics miniaturization and packaging and the conversion of electrical energy from one form to another and its management through multichip module structures used in all possible switching converter applications.

The use of MCM-D, MCM-L, MCM-F/BGA, etc., and combinations thereof, and the like structures allow for power electronic system design on a single substrate. This technology inherently allows for a minimal footprint, volume and mass design. Due to the minimization of parasitics, we are able to obtain a higher electrical performance, specifically a higher efficiency, and increased reliability. This technology also allows for novel heat removal designs and methods while still maintaining a high level of manufacturing throughput.

In accordance with the present invention, this technology can be utilized in any power electronic system or sub-system which converts electrical energy from ac to dc, dc to ac, dc to dc, or ac to ac. Thus, the uses of this technology are very broad based. We have chosen to focus on a challenging, high-volume, industrial application, that of a self-contained variable-speed induction motor drive which can be integrated into or onto an electric motor casing or frame.

The high cost of this technology is overcome by economies of scale or mass production. The high heat dissipation per centimeter requirements due to increased system integration with this technology can be overcome by the use of high thermal conductivity substrates and novel thermal management techniques. For example, microchannels can be used to allow cooling by air circulation or other cooling fluid circulation (see FIGS. 16 and 19). Also, thermal chimneys (i.e., vias filled with thermally-conductive materials) may be used beneath the PSDS or other heat-generating components to get heat to cooling air flow.

In accordance with another embodiment of the present invention, there is provided an embedded magnetic process for producing the single substrate devices of the present invention (see FIGS. 15–20).

A conventional electric motor power module is a multi-component item housed in a control box, separate from the electric machine, but connected via electrical conductors (i.e., cables). In accordance with the present invention, a power electronics multichip module (MCM) of approximately 3½ by 3½ inches by less than ½ inch, contains all of the components of a conventional power module. This MCM technology is used to form relatively small, thin, light, and even flexible circuits which combine multiple integrated circuits and electronic components on a single substrate. Conventional electric motor drives have a number of discrete separate circuit chips and components attached to sockets on one or more substrates or boards. In accordance with the present invention, all of the components of a conventional motor drive can be formed on a single substrate as a plurality of subcircuits or integrated circuits including low-power components and high-power components. Hence, there is provided a novel and unique power electronics module or multiple circuit integrated circuit.

In accordance with the present invention, the design and fabrication of a highly integrated, intelligent integral horsepower, three-phase induction motor drive is based on multichip module (MCM) technology. In accordance with the present invention, a conventional three-phase induction motor is transformed into a stand alone variable-speed drive by way of MCM technology. This solid-state controller-known as a multichip power module (MCPM)-uses known good die (KGD) to obtain minimal footprint, volume, and mass, while maximizing efficiency, reliability, and manufacturability. This is done by integrating the low-power control and high-power sections onto a single substrate, of diamond, silicon, metal, DBO, IMS, etc. For example see FIGS. 8–10.

In accordance with one embodiment of the present invention, an integrated circuit assembly formed on a single substrate is capable of transforming and controlling single or multiphase alternating current (AC) power input to direct current (DC) power output responsive to input signals and includes on a single substrate a power rectifier subcircuit of either the passive or active type, an energy-transfering link functioning as a filter, subcircuit at the rectifier output which may be either capacitive and/or inductive in nature, a controller subcircuit including low-power digital electronic circuits for controlling the power rectifier subcircuit, and a communication subcircuit having an output received by the controller subcircuit and inputs for receiving signals from an external source (see FIG. 11).

In accordance with another embodiment, an integrated circuit assembly on a single substrate is capable of receiving a consistant magnitude direct current power and controlling it and transforming it to alternating current power in single phase or multiphase form having variable magnitude and/or variable frequency and includes on a single substrate a subcircuit in the form of a power inverter including thyristors or other power semiconductor switching devices, a controller subcircuit with outputs controlling the switching devices of the power converter and including digital integrated circuitry, and a communication subcircuit with an output to the controller and with inputs for receiving communication signals from external sources (see FIG. 12).

In accordance with a further embodiment, an integrated circuit assembly on a single substrate is capable of receiving constant magnitude, constant frequency alternating current power and controlling it and transforming it to alternating current power in single phase or multiphase form having variable magnitude and/or variable frequency and includes on a single substrate a power rectifier subcircuit of either the passive or active type, an energy-transferring link subcircuit which may be either capacitive or inductive, a subcircuit in the form of a power inverter including thyristors or other power semiconductor switching devices, a controller subcircuit with outputs controlling the switching devices of the power converter and including digital integrated circuitry, and a communication subcircuit with an output to the controller and with inputs for receiving communication signals from external sources.

The principle object of the present invention is the provision of an apparatus, system, device, circuit, component, or the like for converting electrical energy from one form to another.

Another object of the present invention is the provision of an apparatus, system, method, device, circuit, component, or the like for the conversion of electrical energy from one form to another and its management through multichip module structures.

A still further object of the present invention is the provision of the design and fabrication of integrated circuits, power electronics, single substrate integrated circuits containing both low-power and high-power sections, and/or multichip module structures.

A more particular object of the present invention is the provision of the design and fabrication of a highly integrated, intelligent, integral horsepower, 3-phase induction motor drive.

Yet another object of the present invention is the provision of a stand-alone variable-speed drive including a multichip power module solid-state controller.

Other objects and further scope of the applicability of the present invention will become apparent from the detailed description to follow, taken in conjunction with the accompanying drawings, wherein like parts are designated by like reference numerals.

BRIEF DESCRIPTION OF THE SEVERAL VIEWS OF THE DRAWING

FIG. 17 is a schematic perspective view representation of MCPM on a flexible substrate utilzing ball-grid array interconnects.

FIG. 18 is a schematic perspective view illustration of an MCPM on a flexible substrate with embedded magnetics in accordance with another example of the present invention.

DETAILED DESCRIPTION OF THE INVENTION

Figure 1:
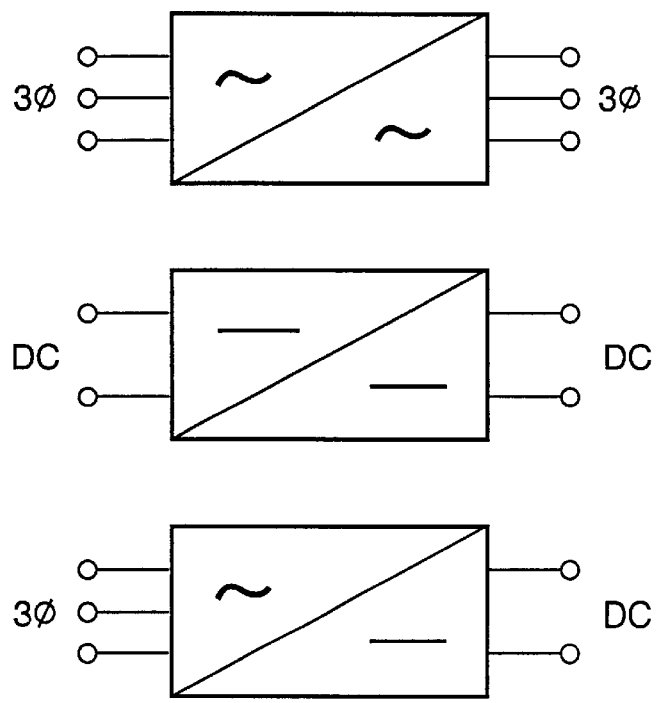
FIG. 1 is a schematic circuit diagram of power electronic "building blocks" used in the present system design. Note that, single-phase inputs can be applied to any two terminals on the left-hand side denoted by 3.

In accordance with at least one embodiment of the present invention, there is provided a new and unique process for building configurable power electronics building blocks. In accordance with the present invention, multichip module (MCM) technology for power electronics miniaturization and packaging is utilized. Further, processes and procedures developed at or in the University of Arkansas High Density Electronic Center (HiDEC) are used to produce power electronic applications where hybrid, thick-film technology is the present state of the art. Moreover, the present invention is directed to the use of multichip module technology for power electronics miniaturization and packaging and the conversion of electrical energy from one form to another and its management through multichip module structures.

The use of MCM-D, MCM-L, MCM-F/BGA, and the like structures allow for power electronic system design on a single substrate. This technology inherently allows for a minimal footprint, volume and mass design. Due to the minimization of parasitics, we are able to obtain a higher electrical performance, specifically a higher efficiency, and increased reliability. This technology also allows for novel heat removal designs and methods while still maintaining a high level of manufacturing throughput.

In accordance with the present invention, this technology can be utilized in any power electronic system or sub-system which converts electrical energy from ac to dc, dc to ac, dc to dc, or ac to ac. Thus, the uses of this technology are very broad based. We have chosen to focus on a challenging, high-volume, industrial application, that of a self-contained variable-speed induction motor drive which can be integrated into or onto an electric motor.

The high cost of this technology is overcome by economies of scale or mass production. The high heat dissipation per centimeter requirements due to increased system integration with this technology can be overcome by the use of high thermal conductivity substrates and novel thermal management techniques. For example, microchannels can be used to allow cooling by air circulation or other cooling fluid circulation (see FIGS. 16 and 19). Also, thermal chimneys (i.e., vias filled with thermally-conductive materials) may be used beneath the PSDS or other heat-generating components to get heat to cooling air flow.

In accordance with another embodiment of the present invention, there is provided an embedded magnetic process for producing the single substrate devices of the present invention (see FIGS. 15–20).

In accordance with another embodiment of the present invention, there is provided an embedded magnetic process for producing the single substrate devices of the present invention.

A conventional electric motor power module is a multi-component item housed in a control box, separate from the electric machine, but connected via electrical conductors (i.e., cables). In accordance with the present invention, a power electronics multichip module (MCM) of approximately 3½ by 3½ inches by less than 1/2 inch, contains all of the components of a conventional power module. This MCM technology is used to form relatively small, thin, light, and even flexible circuits which combine multiple integrated circuits and electronic components on a single substrate. Conventional electric motor drives have a number of discrete separate circuit chips and components attached to sockets on one or more substrates or boards. In accordance with the present invention, all of the components of a conventional motor drive can be formed on a single substrate as a plurality of subcircuits or integrated circuits including low-power components and high-power components. Hence, there is provided a novel and unique power electronics module or multiple circuit integrated circuit.

The Use of MCM Technology

As the complexity of power electronic systems increases, packaging will continue to become a more important, but easily overlooked, issue in high-power electronics manufacturing. Based on specific application specifications, the need to miniaturize complex power electronic systems may be necessitated based on footprint, volume, mass, and cost constraints. For these and other reasons, many applications may require that MCM packaging technology be used rather than a hybrid packaging approach. As discussed in [2] and [3], there are numerous MCM-based products on the market by a variety of companies. Some of these include: mainframe computers (IBM, Unisys and Siemens), computer workstations or servers (Control Data, Fujitsu, IBM, NCR, NEC, Silicon Graphics, Sun Microsystems and Tadpole Technology), portable personal computers (IBM, Integral, ITRI (Taiwan), MicroModule Systems, Seiko Epson), cellular phones and other telecommunications products (AT&T, Matsushita, Nokia, Northern Telecom, Toshiba), consumer products (Matsushita), automotive (Mercedes-Benz), military (Rockwell, Hughes, Honeywell), and medical (Medtronics) [3].

MCM packaging is a refinement of the hybrid packaging technology. It is defined as a single electronic package containing several ICs or power devices, and sometimes, passive circuit elements. MCMs combine high performance ICs with a custom-designed common-substrate structure which provides mechanical support for chips and multiple layers of conductors to interconnect them [4]. MCMs are built using a variety of methods, including fine-line printed wiring board technology (MCM-L), co-fired ceramic (MCM-C), thin-film or photolithographic techniques on silicon, ceramic, or metal substrates (MCM-D), and hybrids of the previous two, (MCM-C/D) [2,4]. A novel MCM technology introduced by General Electric R&D attempts to bridge the gap between the performance of MCM-D and MCM-L substrates through a conformal multichip-on-flex (MCM-F) technology. MCM-F inherently possesses the low-cost features and materials of MCM-L while maintaining the excellent performance of MCM-D technology. Additional details on the MCM-F technology, along with its plastic-encapsulated variant (MCM-E/F), can be found in [3]. No matter what methodology is being utilized, MCM technology attempts to realize the maximum performance from ICs, and thereby electronic systems, by minimizing the impact of the package [4]. As a result, the circuit designer should expect improved electrical performance, increased IC packaging density, further miniaturization, reduced power consumption, increased reliability, better thermal dissipation and heat removal.

Present-day MCM technology is mainly geared toward high-speed and high-performance digital computer products, with little movement toward higher power levels. The ultimate goal for MCM foundries, vendors, and test companies is to push the rate of MCM adoption past that of surface mount technology and the use of application specific integrated circuits (ASICs).

Power electronics packaging presents several challenges that are not facing the present MCM packaging technology: thermal dissipation and interconnect current density. Thermal design of MCM packages must consider such factors as: (1) how heat is to be removed from the power ICs or devices (through the substrate or directly off the backside of the chip); (2) whether to use forced air or liquid cooling; (3) the use of a high thermal conductivity substrate such as diamond (high thermal conductivity substrates such as diamond are expected to greatly impact the MCM packaging technology for high-power electronic systems) or thermal vias; and (4) stresses induced in the chips and substrate due to mismatch in thermal coefficients of expansion. To address these issues, the Intelligent Multichip Module Analyzer (IMCMA), a finite-element program available from the U.S. Air Force Rome Laboratory [5], was used. Since some of the conductors in high-power electronics systems carry substantial currents at high voltage levels, designers must be particularly careful not to exceed the conductor electromigration current limit and dielectric breakdown strength. All of the above considerations impact performance, cost, and reliability.

HiDEC MCM Fabrication Facility

The HiDEC facility at the University of Arkansas was established in 1991.Originally an outgrowth of work on thallium-based high-temperature superconducting (HTSC) materials (former world-record holder for the highest temperature superconductor) and their application to superconducting MCM interconnects, HiDEC quickly expanded to include work on synthetic diamond MCM substrates and new MCM topologies optimized for production processes.

Located at the University of Arkansas Engineering Research Center, the HiDEC facility contains over 4000 ft$^2$ of Class 100 and 1000 clean room space for most of the MCM substrate/interconnect fabrication and assembly, with research areas for thallium and other HTSC materials, laser processing, and a microwave plasma-enhanced chemical vapor deposition (PECVD) and hot-filament chemical vapor deposition (CVD) system for diamond deposition. Approximately one-half of the facility contains a fabrication line for conventional thin-film MCMs where aluminum metal and silicon dioxide or polyimide dielectric MCMs can be fabricated on five-inch silicon substrates. This capability allows HiDEC to expand into research on cost reduction of conventional MCMs. The HiDEC complex includes a separate facility housing administrative offices, CAD facilities, electrical test equipment, reliability labs, and analytical equipment. The HiDEC design capability consists of several Sun SPARC stations running the Mentor Graphics CAD software package. State-of-the-art facilities allow HiDEC personnel to pursue a program of research, industrial liaison, and education unique among American educational institutions.

The Multichip Power Module (MCPM)-Based Variable-Speed Induction Motor Drive In the development of the present MCPM-based drive, we held to one fast design constraint-all semiconductor elements must be in die form (i.e., only KGD). This "self-imposed" constraint led to the realization of two points. First, we were not prepared for the difficulty in obtaining the die in small, sample quantities; and second, the nature of this project gave rise to unique constraints directing the design process. The vast pool of suitable components usually available to the designer were unavailable in die form, thus forcing the design to take place within artificially-restrictive boundaries. For example, some products were either not available in bare die form, or for proprietary reasons were not available to the public sector without first being encapsulated, etc.

A. MCPM Overall Requirements

The primary purpose of the present design project was to transform the conventional three-phase induction motor into a stand-alone variable-speed drive by means of MCM technology. The conventional industrial variable-speed drive consists of the motor connected to the supply line via a solid-state inverter, a separate, free-standing unit. Control of the motor is then usually carried out through this inverter by means of a keypad, detached, or integral with the inverter, a PC connected via a data link, or analog controls integral with the inverter. By shrinking the inverter and its controller by means of MCM technology and integrating the electronics into the motor frame, the motor is transformed into a "Smart Motor". This means that the user need only supply the motor with its normal three-phase connection and provide some control interface in order to obtain a fully self-contained variable-speed drive.

Figure 2:
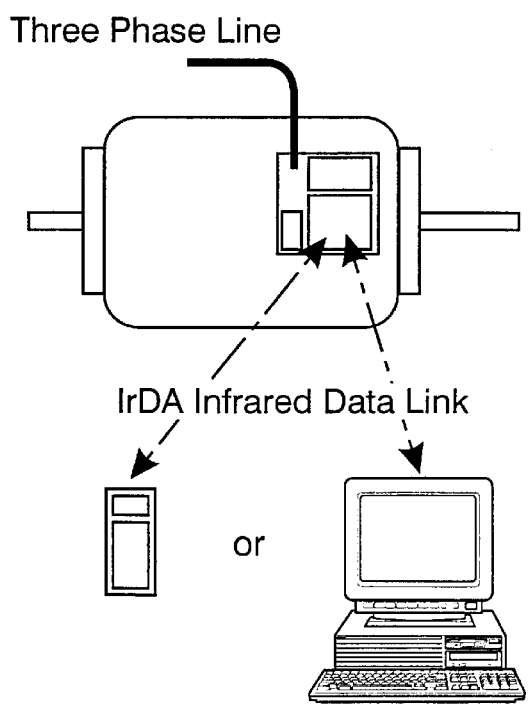
FIG. 2 is a schematic diagram of a smart motor interface or system (plug-and-play power electronics or power in-power out- bi-directional control) in accordance with the present invention.

The MCPM module should be constructed to fit into the space provided for cable entry into the motor or a modified junction box fixed in this position. The external components, in this embodiment, the dc-link capacitor and low-voltage power supplies are also mounted within this box. It is preferred that the dc-link capaciter and low voltage power supplies be on the MCPM module. Since the module does not contain an isolation transformer and is connected directly to the three-phase line, the negative rail of the front-end diode bridge rectifier, which also references, via a sense resistor to the electronics/signal ground, cannot be earthed. Therefore, the data connection ground also needs to float with respect to earth. This requires that the data connection be galvanically-isolated from the module electronics it serves, as it would not be safe practice to float the hand held programmer or PC. One of the more elegant solutions to this problem is to make use of optical methods of data communication. The Hewlett-Packard HSDL1000, for example, available in surface mount, measuring some 8.5 mm by 13.2 mm, is a preferred item for providing the serial data communications between module and programmer/PC as shown in FIG. 2.

Another elegant solution is the implementation of embedded ferromagnetic technology (EFT) as described in [6]. An isolation transformer using advanced laser drilling and PWB fabrication techniques has already been demonstrated. The EFT methods provide significant improvement in electrical performance, quality, and reliability at a lower manufactured cost. The EFT fabrication process is robust and can be used to create high-performance magnetic structures including: isolation transformers, common-mode chokes, baluns, etc.

Implementing either of the solutions above results in the power cable being the only electrical connection made to the "Smart Motor", thereby reducing it to an off-the-shelf induction motor from the point of view of the installation electrician.

B. The MCPM Design Specifications

The design goals for this sample module consist of the following: three-phase, 180–260 Volts, 10 Amp, 50/60 Hz input power range, also capable of accepting single-phase or dc inputs, integral horsepower, displacement power factor of at least 0.90, efficiency to exceed 90%, ambient temperature range of –15 to 40° C., withstand vibrations of at least 0.5 G @ 20 Hz, control method must be a form of PWM, switching frequency to be above the audible range, output frequency from 0.25 to 120 Hz with a resolution of at least 0.25 Hz, overload current capability of 150% for at least one minute, and software-based output current controls the motor.

Figure 3:
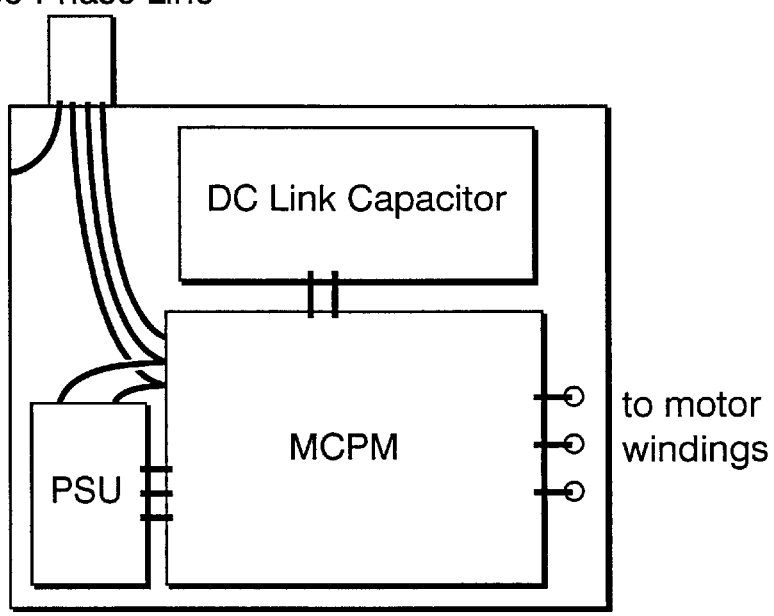
FIG. 3 is a schematic top view of one possible module layout and junction box interconnections in accordance with the present invention. The desired layout would include the dc link capacitor and PSU within/on the MCPM as shown in FIG. 10. (Braking resistor is not shown.)

The present technical difficulties associated with the fabrication of the dc-link capacitor and power supplies for the module electronics are placed outside the module, but in close proximity to the same, with the motor junction box as shown in FIG. 3.

C. MCPM Substrate Construction

The inverter prototype is built using multi-chip deposit (MCM-D) technology. The technology has achieved faster speeds in computers by removing the bulky packaging of individual ICs thus shortening the interconnect length between neighboring devices. The bare die are placed on one large substrate that may be, but is not limited to, silicon. The combined system is then placed in a single package before being introduced into a larger system. The multi-chip process is used in this project to assist in reducing the size of the power module. The inverter is constructed on a 12.7 cm silicon wafer. The design consists of three metal layers of copper with the interlevel dielectric being benzocyclobutene (BCB). This polymer has excellent dielectric properties; an important one being its compatibility with copper.

In accordance with one example, the fabrication process begins with a conductive silicon wafer that is covered with a four micron insulating layer of silicon dioxide deposited via plasma enhanced chemical vapor deposition or PECVD. Since oxide and copper are incompatible, a 500 Å barrier layer of titanium is sputtered on the oxide before 1000 Å of copper and another 500 Å of titanium are sputtered. The last layer of titanium is used for plating purposes. Both the first and second metal layers are to be 15 microns thick to carry the high current needs. This last layer of titanium is used to connect the clips during plating. Plated copper will not adhere to titanium which makes it easier to clean the areas where the clips are placed. An additive process is used to plate the copper so 14 microns of AZ4330 positive resist is dispensed on the wafer using a double coat process and exposed using a Karl Suss MA150. After development the wafers are placed in hard bake for thirty minutes. The electroplating is carried out in a sulfuric acid/copper sulfate bath using a rotating electrode disk to insure uniformity of around 5%. The current density is run at 10 mA/cm$^2$ with the disc rotating at 96 rpm. Once the copper is plated, the resist is removed and the seed layers of titanium and copper are chemically etched away.

The interlevel dielectric will need to separate the two metal planes by 10 microns so the total thickness of the BCB in some areas will be 25 microns. The non-photodefinable BCB formulation 3022–63 is dispensed onto the plated copper in much the same way the resist had been applied. An adhesion promotor consisting of Aminopropyltriethyloxysilane (APS) is placed on the wafer surface prior to the BCB application. The polymer is then baked at 250° C. for two hours to partially cure the material. This partial cure allows the second layer of polymer to be applied later to adhere to the first. After cure, a hard mask of 2500Å of aluminum is sputtered and patterned. To open holes in the BCB, a reactive ion etch (RIE) is performed using 45% SF$_6$ in O$_2$ that removes approximately one micron/minute. With the BCB areas opened, the aluminum is removed chemically. The next metal and BCB layer is fabricated in the same fashion as the first.

Figure 4:
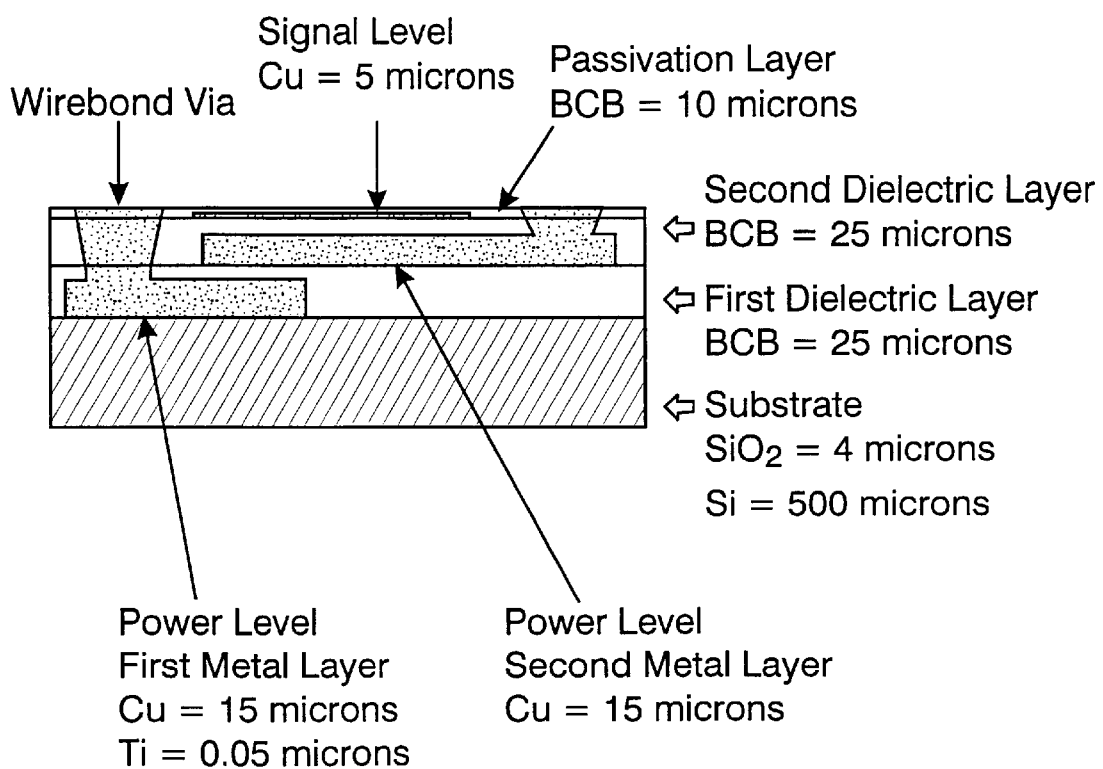
FIG. 4 is a cross-section illustration of the MCPM-based variable-speed induction motor drive of the present invention using MCM-D technology.

The top metal is designed to route the lower power control signals to their appropriate destinations, and though it will have the same seed layer as mentioned before, it will only be plated to five microns of copper which is sufficient to insure wirebonding over BCB. The passivation layer of BCB is to be ten microns thick with openings made as described before to create wirebond sites and to allow proper seating of active devices on the substrate. Once the substrate is fabricated, the top surface is populated with the active devices all of which is in bare die form. A cross-section of the MCPM is shown in FIG. 4.

Figure 5:
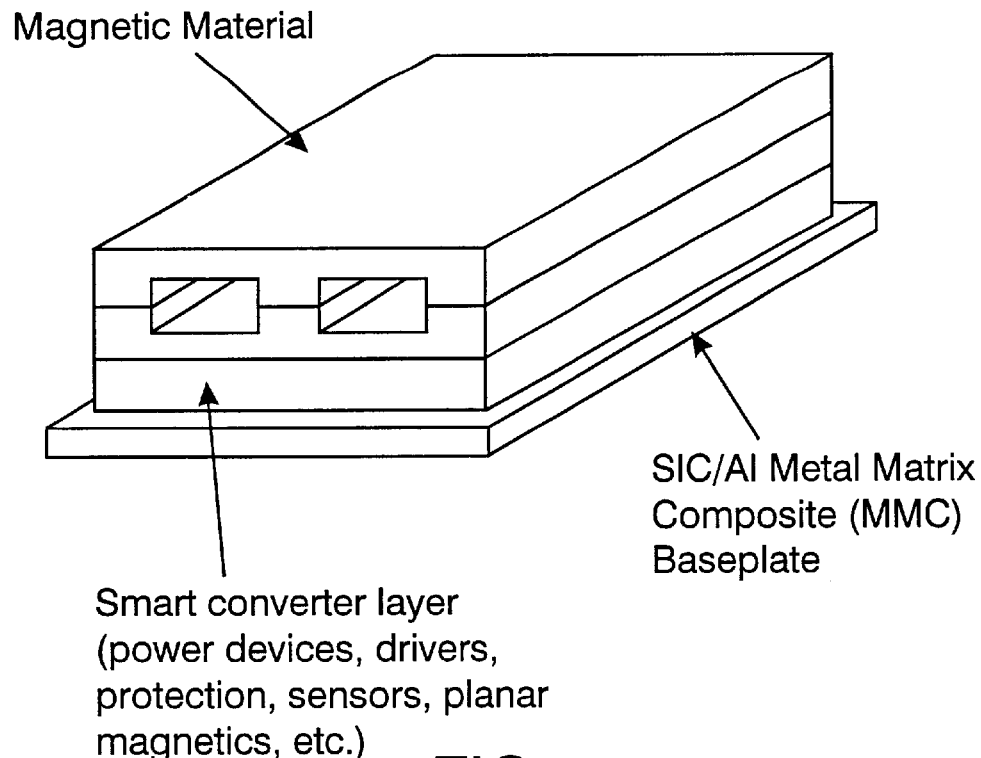
FIG. 5 is a perspective view representation of an MCPM with a possible electromagnetic layer for integrated energy storage elements in accordance with the present invention

The substrate is then placed in a package to be incorporated into a larger enclosure housing where the low-voltage dc power supplies and the dc link capacitor reside, if not included on the same substrate. Preferably, the silicon substrate is housed in a ceramic-like material that has a similar thermal coefficient of expansion [4,7] as shown in FIG. 5. Unfortunately such a customized package is costly so an aluminum package can be used to hold the substrate. Caution should be exercised to ensure cracking of the substrate does not occur during temperature excursions such as die attach cure.

D. MCPM Layout

Figure 6:
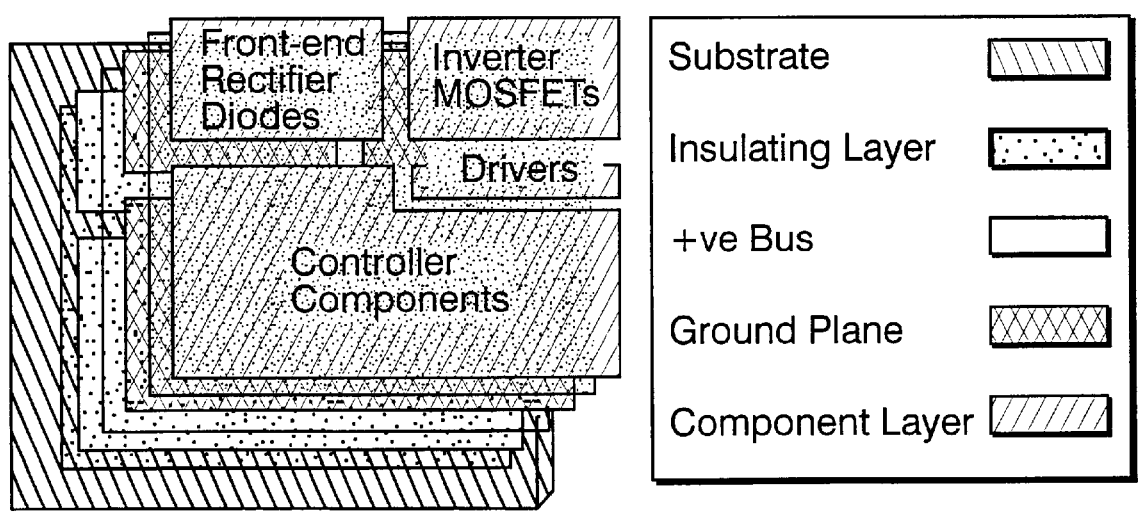
FIG. 6 is a schematic layer diagram of the planar bus structure.

The laminated (planar) busbar techniques shown in FIG. 6 are used to reduce the overall stray inductances of the module, which gives rise to voltage spikes resulting from di/dt effects. Reducing these voltage spikes decreases the chances of PSD failure (i.e., MOSFET failure in our case) as well as making snubber circuits unnecessary. With a reduction in the overvoltage spikes, higher switching speeds can also be attained.

Although the layout for MCM fabricating does differ from conventional construction techniques, the planar bus structure of FIG. 6 is adapted to MCM layout and fabrication methods which reduce stray inductances. Further, moving perpendicular to the planes, insulation between the layers is of paramount importance. Connections between the components on the component layer plane to the ground and +ve bus planes must be made with due regard to the voltage differences existing between these two planes. Moving parallel to and with the planes, the insulation philosophy must take into account the effect of creepage and tracking. This applies to the +DC Link and +15V and +5 V sections of the +ve bus plane, the islands surrounding the vias with a plane and plane edges of FIG. 7. Sufficient clearance must be provided in these cases.

Since the power and signal grounds are common, they share the same ground plane. (As mentioned earlier, the ground plane is not at the same potential as the power earth and must be allowed to float.) This could give rise to circulating (ground) currents between the power and signal sections. Great care has to be taken to avoid this. Such circulating currents could seriously effect the correct functioning of the controller. Therefore, "daisy-chaining" of the ground connections to a common point should be avoided. Generally, the power and signal grounds would be brought to the same ground point along separate conductors. The structure of the ground plane shown in FIG. 7 tries to route the ground currents in this fashion.

Figure 7:
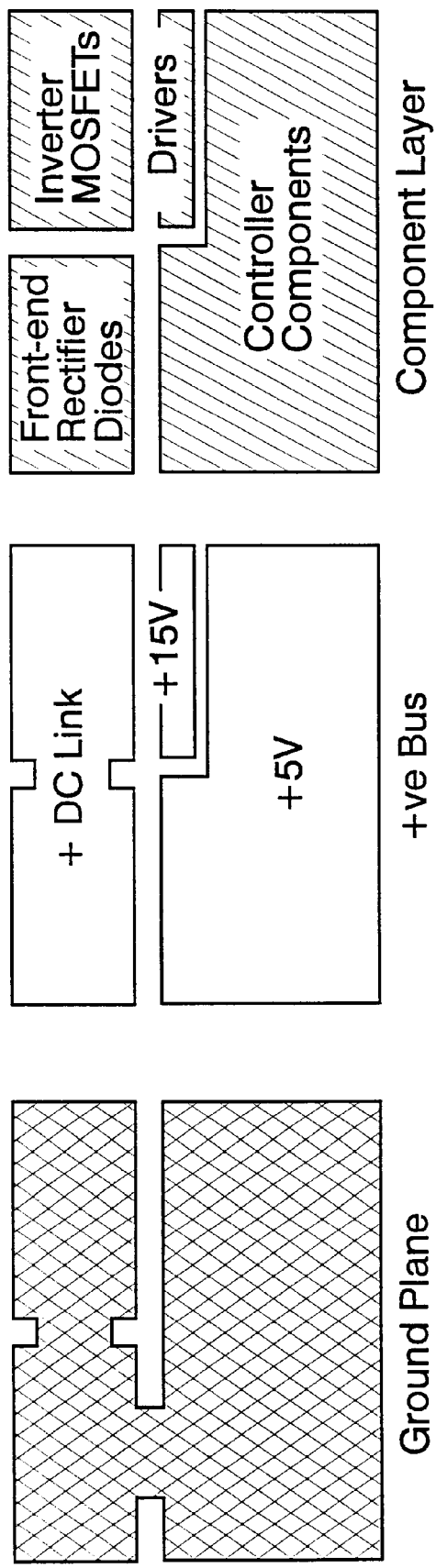
FIG. 7 is a schematic illustration of plane layouts.
Figure 8:
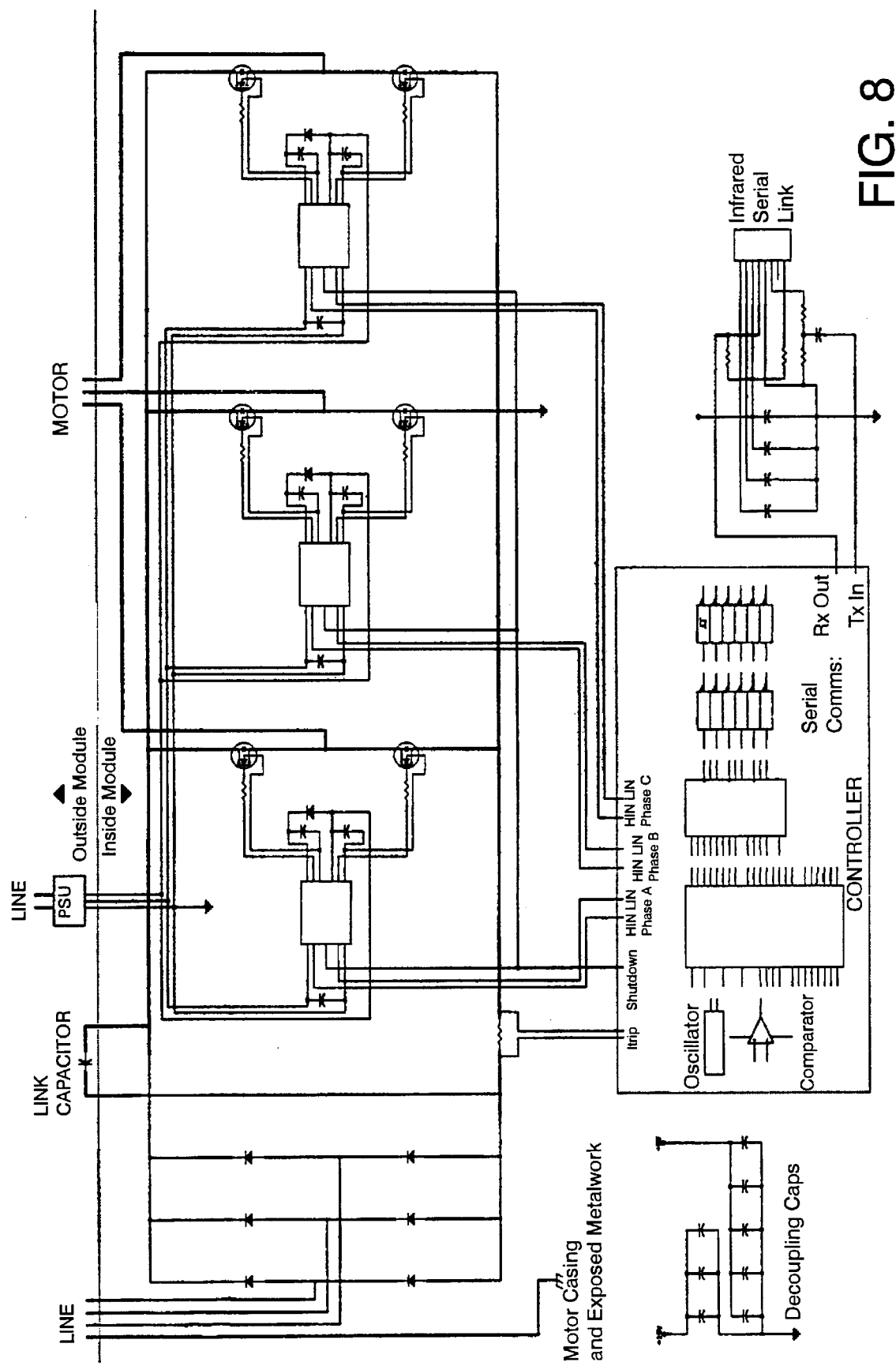
FIG. 8 is a schematic circuit diagram of one version of the MCPM smart motor drive module.

The interconnections between components (power and signal) which are not either +ve bus or ground referenced, are made in the plane of the Component Layer of FIG. 7. FIG. 8, the MCPM "Smart Motor" drive circuit schematic, clearly differentiates between the power and signal circuits and these should be separated as far as possible in the physical layout. Note the parallel routing of the IR2132 driver outputs to the gate and source connections of the PSDs.

E. Discussion of the MCPM "SmartMotor" Drive Schematic (FIG. 8)

(i.) Front-end rectifier

In this particular design embodiment, it was felt that the advantages of going the route of an active front-end rectifier was not justified. The need to regenerate energy back into the grid is not called for at the power levels associated with this module, nor can the marginal improvements in displacement power factor and the like justify the much increased controller complexity, bearing in mind the difficulty in obtaining a variety of dice. The module does allow for three-phase, single-phase, as well as dc input up to nominal line voltages.

With a diode front-end, reverse power flow from the motor would have to be dissipated in a braking resistor. This feature was suggested in the original design and although it is relatively easy to implement using conventionally-packaged components and an external braking resistor, regenerative braking was not implemented in this embodiment. This was in keeping with the philosophy of restricting our "hunt" for candidate bare die. Deceleration of the load is programmed to occur in a controlled manner, where the small amounts of energy concerned are dissipated in the motor windings.

Except in the case of a dc input, this configuration necessitates the floating of the negative rail of the rectifier bridge with respect to earth. This is due to the absence of a "small" isolation transformer. However, with the use of EFT [6], we can add a small isolation transformer and add much flexibility in another embodiment of the design (see FIG. 20).

The earth connection is then made to the exposed metalwork of the module (i.e., if applicable) and to the motor frame for safety reasons. The electronics/signal ground of the module, of course, has to connect to the negative rail of the rectifier. As mentioned earlier, this necessitates isolation between the module electronics and any peripheral device used for communicating the control data. An optical link certainly provides the most elegant solution. In general, where a data connection is required, a larger rated drive would make use of a transformer within its power supplies, while the smaller drive would require careful isolation of the electronics from the operator and would need isolation for its communications link (i.e., opto-isolators) as well. The alternative method of floating the PC or other peripheral devices should not be contemplated for obvious safety concerns.

(ii.) DC-link capacitor

The final value of this component is determined, largely by experiment, in order to minimize the physical size of the capacitor while still maintaining adequate dc voltage stability on the dc link. At the power levels associated with the present module and the fact that this design iteration is not concerned with optimizing machine or line harmonics, the size of this component is reduced more than usual. With a novel coordinated modulation strategy between an active front-end rectifier and inverter, the dc-link capacitor can be sized on the order of a few hundred nanofarads.

(iii.) Voltage-source inverter PSDs

The inverter portion of the MCPM is a conventional three-phase full-bridge consisting of MOSFET devices incorporating the default free-wheeling diodes. The ratings of the devices provide the design with ample "headroom" from both current and power dissipation points of view, although care still must be taken with layout to keep the voltage spikes with the device's safe operating area (SOA), as the nominal input voltage levels to the module are approached.

The headroom available with respect to current capability and the fact that the present module is not designed as a high performance device, allows us to "ease off" on the switching requirements, resulting in the following advantages:

dispense with the need for snubbers or voltage clamps for each switching device or phase arm.

to make use of the (non-ideal) free-body diode for free-wheeling purposes.

assist the layout constraints in reducing voltage spikes. Control of the switching speeds with the gate resistors (R1 through R6 of FIG. 8) and setting minimum pulse widths and switching frequencies through the controller, is used to this effect.

(iv.) Drivers and protection

Although certain reservations were initially expressed regarding the output capability of the IR2132, with the decision to ease the drive requirements of the MOSFETs, this device became more attractive since it incorporated most of the functions of the driver section (i.e., drivers for all six switches, overcurrent protection (global), undervoltage lockout, and built-in dead time between upper and lower switches within a given phase arm).

(v.) The controller

The PIC16C74 by Microchip was chosen as the microcontroller based largely on the availability of KGD. Alternatively, a controller similar to Motorola's HC08MP16 can be used.

(vi.) Power supplies

Again, as a result of the restrictions placed on KGD supply, the power supplies (+15 V and +5 V) for the present module electronics were built using conventional packaged devices and so reside outside the module, alongside it in the junction box. Simple resistive dividers deriving the power from the dc link would not be practical, given the hundreds of milli-amps required by the module electronics.

Note in FIG. 8, the decoupling capacitors shown in the schematic. Obviously, they must be placed as close as possible to their respective KGD in order to provide effective decoupling.

Conclusions

This particular embodiment of the present invention is directed to the design and fabrication of a highly integrated, intelligent, integral horsepower, three-phase induction motor drive based on multichip module (MCM) technology. The transformation of a conventional three-phase induction motor into a stand-alone variable-speed drive by means of MCM technology is achieved. This solid-state controller-known as a multichip power module (MCPM)-uses known good die (KGD) to obtain minimal footprint, volume, and mass, while maximizing efficiency, reliability, and manufacturability. This is done by integrating the low-power control and high-power sections onto a single silicon substrate.

References

1. D. Andrews, S. Ang, D. Berleant W. Brown, J. Conrad, R. Couvillion, J. Demmin, E. Fritsch-Faules, W. Johnson, T. Lenihan, R. Maistrom, H. Naseem, S. Nasrazadani, L. Schaper, W. Schmidt, and R. Uhich, "Advanced Electronic Packaging: With Emphasis on Multi-Chip Modules", in preparation.
2. P. Emerald and P. Greenland, "Power Multi-Chip Modules (PMCM™): Insights into the Destiny of Smart Components as Sub-Systems", in Proc. of PCIM'94-Power Conversion, September 1994.
3. P. Emerald and M. Sasaki, "Multi-Chip Modules for Stepper Motors Integrate PWM Control with Power FETs for Superb Performance", in Proc. of PCIM'94-Intelligent Motion, September 1994.
4. J. F. Trites and K. Krone, "Embedded Ferromagnetic Technology: Automated High Volume Manufacturing of Magnetic Components", in Proc. of the Intl. Electronic Packaging Soc. Conf., pp. 203–210, September/October 1996.
5. K. J. Olejniczak, K. C. Burgers, S. S. Ang, A. P. Malshe, H. A. Naseem, and W. D. Brown, "On the Role of Diamond, HTS, and a Novel MCM Topology in the Development of Multichip Power Modules (MCPMs) for Space Applications", Proc. of the 13the Symp. on Space Nuclear Power and Propulsion, AIP Conference Proceedings 361, part III, pp. 1335–1338, January 1996.
6. I. W. Hofsajer, J. A. Ferreira, and J. D. van Wyk, "A New Manufacturing and Packaging Technology for the Integration of Power Electronics", Conf. Rec. of the 1995 IEEE IAS Annual Meeting, Vol. 1, pp. 891–897, October 1995.
7. S. C. Tasker and Z. Sekulic, "Adopting Multichip-Module Technology", Electronic Design, pp. 153–160, Jun. 27, 1994.
8. D. Maliniak, "MCMs Traverse the Cost Curve", Electronic Design, pp. 41–52, Jun. 26, 1995.
9. G. L. Romero and J. L. Martinez, Jr., "Development of Metal Matrix Composite Baseplate Technology for High Current Power Modules", Int'l. Conf. of Microcircuits and Electronics Packaging, v. 18, pp. 246–251, 1995.
10. A User's Guide to Intelligent Multichip Module Analyzer (IMCMA), U.S. Air Force Rome Laboratory, Rome, N. Y., Jun. 1, 1995.
11. T. Bussarakons, "Application Specific Power Modules Cut Size and Weight, Improve Environmental, Electrical and Thermal Performance", Power Conversion & Intelligent Motion (PCIM), pp. 34 38, November 1996.

The Use of Multi-chip Module Technology for
Power Electronics Miniaturization and Packaging
Outline Trends in power electronics Increasing functionality Multi-Chip Module (MCM) Concept HiDEC facility MCM power application (MCPM)

Design specifications

Controller requirements

MCPM substrate layout and construction

Conclusion

Trends in Power Electronics

Power electronics converts electrical energy from one form to another

Replace discrete devices with solid-state electronics

This technology improved performance and reliability of low power consumer products Military and the industrial sectors are investigating the miniaturization and packaging of high-power electronics

Increasing Functionality

Miniaturization achieved by putting more functions into a smaller space

Many products have been introduced into the market that combine several functions together The size of individual packaging could pose problems in space restrictive applications 3.0 The present design addresses the packaging hurdle Placing multiple bare chips in one package offers the following advantages:

Reduces the overall size, volume and mass of the circuit

Offers an improvement in reliability by reducing the number of interconnections between devices Shorter trace lengths reduces stray parasitic impedances

Multi-chip Concept

A Multi-Chip Module (MCM) incorporates several ICs in a single package

This technology has successfully enhanced the performance of computers

MCMs should offer similar advantages to power electronics as well

| Parameter/Property | MCM-L | MCM-C | MCM-D |
| --- | --- | --- | --- |
| Substrate materials (typ.) | FR4 | $Al_2O_3$ | Silicon |
| Substrate costs | Low | Moderate | Moderate |
| # of Metal layers | 4–8 typ. | 6–12 typ. | 2–4 typ. |
| Conductor Resistance (m Ω/sq.) | 0.15–3 | 2–20 | 3–35 |
| Thermal Conductivity (W/m° C.) | 0.15–0.35 | 1.5–20 | 0.15–1 |
| CTE (ppm/° C.) | 4–16 | 3–8 | 3–7.5 |

HiDEC Facility

Established in 1991 initially to continue work on high temperature superconductors Grew to contain 4,000 ft$^2$ of Class 100 and 1000 cleanroom space for MCM substrate fabrication The facility has substrate design capabilities as well via Mentor Graphics

High Power MCM Application (MCPM Motor Controller)

The fabrication of an inverter that transforms an induction motor into a variable speed drive The inverter is to be small enough to be integrated with the motor frame and be self contained Programming features are to be available with data transmission being sent optically or RS232, RS485, etc. are also permissible.

Example MCPM Design Specifications

Controller to accept 180–260 Volts, 10 Amp, 50/60 Hz input power range

Generate an adjustable three-phase output from 0.25 to 120 Hz

Operate at 90% efficiency, power factor of 0.9, and at temperatures from −15 to 40° C.

Most components housed in the MCM package

Inverter Requirements

A variable speed motor controller must provide
  PWM signals for six switching elements
  A user interface
  Necessary dead time between upper and lower switches in each phase arm
  Floating drive capability for high-side switching elements
  Sensors to monitor operation and circuitry to initiate shutdown in case of a fault condition

Inverter Components

Front-end rectifier
Power switching devices (PSDs)
Drivers and protection
Controller

Substrate Construction

Inverter built using MCM-D technology
A 125 mm silicon wafer insulated with silicon dioxide
Three metal layers are applied, two routing power while a third directs signal traces
Each metal layer separated by a polymer
Substrate then packaged in a custom aluminum package for added strength

Substrate Layout

Planar layout used to reduce stray inductances
Power and signal connections brought to ground through separate conductors
Power and signal traces clearly partitioned in the substrate layout

MCPM Smart Motor Drive Example

Early Development

The nature of the development of the present MCPM Smart Motor Drive design gave rise to unique constraints directing the design process. The vast pool of suitable components usually available to the designer was absent, forcing the design to take place within artificially restrictive boundaries.

These constraints were directly as a result of the difficulties experienced in sourcing the semiconductor elements in bare die form. Issues relating to the availability of the actual nominated candidates, propriety information, large minimum order quantities, and long lead times characterized these difficulties.

The performance envelope of the present module depends on the design restricting itself to the range of (bare die) components available to the designers, as well as the originally mooted (MCM) technological barriers that were encountered.

The choice of micro-controller has a profound effect on what additional semiconductor dies are required, as well as the overall controller philosophy and software structures.

The original development was directed to the fabrication of a surface mount version of the MCPM module.

Overall Requirements

The primary purpose of this MCPM module embodiment or design is to transform the conventional three-phase induction motor into a stand-alone variable-speed drive by means of multi-chip module technology.

Conventional industrial variable-speed drives consist of the motor connected to the supply line via an electronic inverter, a separate, free-standing unit. Control of the motor is then usually carried out through this inverter by means of a keypad, detached, or integral with the inverter, a PC connected via a data link, or analog controls integral with the inverter.

By shrinking the inverter and its controller by means of MCM technology and integrating the electronics into the motor frame, the motor is transformed into a "Smart Motor". This means that the user need only supply the motor with its normal three-phase power connection and provide some control interface in order to obtain a fully self-contained variable-speed drive.

The present MCPM module is preferably constructed to fit into the space provided for cable entry into the motor or a modified junction box fixed in this position. The external components, the DC Link capacitor and low voltage power supplies, are also mounted within this box or on the MCPM substrate.

Referring to FIGS. 2, 3 and 8, since the module does not contain an isolation transformer and is connected directly to the three-phase line, the negative rail of the front-end rectifier, which also references, via Rsense to the electronics ground, cannot be earthed. Therefore, the data connection ground also needs to float with respect to earth. This requires that the data connection be galvanically isolated from the module electronics it serves, as it would not be safe practice to float the hand-held programmer or PC. One of the more elegant solutions to the problem is to make use of optical methods of data communication. The Hewlett-Packard HSDL1000, available in surface mount, measuring some 8.5 mm by 13.2 mm, for less than $10 is the prime candidate for providing the serial data communications between module and programmer/PC.

Implementing this solution results in the power cable being the only electrical connection made to the Smart Motor, thereby reducing it to an off-the-shelf induction motor from the point of view of the installation electrician (FIG. 2).

The MCPM Smart Motor specifications which can be attained depend on the controller and the final hardware configuration. The ability of the controller sets the level of dialogue achievable between the user and the Smart Motor.

Design Considerations

Because of the technological difficulties associated with the fabrication of the DC link capacitor using MCM technology and avoiding further searches for new semiconductor bare dies, the DC link capacitor and power supplies for the present module electronics are placed outside the module, but in close proximity to the same, within the motor junction box.

Interconnections within the junction box can be seen in FIG. 3. Once again, only the three-phase line and control (if not optical) comprise the external connection to the Smart Motor.

Module Layout

Laminated (planar) busbar techniques are used to reduce the overall stray inductances of the module, which give rise to voltage spikes resulting from di/dt effects. Reducing these voltage spikes decreases the chances of MOSFET failure as well as making snubber circuits unnecessary. With a reduction in the over-voltage spikes, higher switching speeds can also be attained.

Taking into account the subtleties of MCM fabrication, the planar bus of FIG. 6, good for conventional construction techniques (and used in the construction of the module prototype), may be adapted to the MCPM version of our module. Within the framework of MCM fabrication methods, some of the ideas are adapted to reduce stray inductances.

Further, moving perpendicular to the planes, insulation between the layers is of paramount importance. Connections between the components on the component layer plane to the ground and +ve bus planes must be made with due regard to the voltage differences existing between these planes.

Moving parallel to and within the planes, the insulation philosophy must take into account the effect of creepage and tracking. This applies to the −DC Link and −15V and +5V sections of the +ve bus plane, the islands surrounding the vias within a plane and plane edges. Sufficient clearance must be provided in these cases.

Since the power and signal grounds are common, they share the same ground plane. (As mentioned earlier, the ground plane is not at the same potential as the power earth and must be allowed to float.)

This could give rise to circulating (ground) currents between the power and signal sections. Great care has to be taken to avoid this. Such circulating currents could seriously effect the correct functioning of the controller.

Therefore, "daisy-chaining" of the ground connections to a common point must be avoided. Generally, the power and signal grounds would be brought to the same ground point along separate conductors. The structure of the ground plane shown in FIG. 7 routes the ground currents in this fashion.

The interconnections between components (power and signal) which are not either +ve bus or ground referenced, are made in the plane of the Component Layer.

The schematic (FIG. 8) clearly differentiates between the power and signal circuits and these should be separated as far as possible in the physical layout. Note the parallel routing of the HIP2500 driver outputs to the Gate and Source connections of the power switching devices.

Front-end Rectifier

It was felt that the advantages of going the route of an active front-end rectifier was not justified in the case of this design (FIG. 8). The need to pump power back into the grid is not called for at the power levels associated with this module. Also, it was felt that the marginal improvements in displacement power factor and the like did not justify a much increased controller complexity, bearing in mind the difficulty in obtaining a variety of dies.

The present module allows for three-phase, single-phase, as well as DC input up to nominal line voltages.

With a diode front-end, reverse power flow from the motor is dissipated in a braking resistor. Although this feature is relatively easy to implement using conventionally packaged components and an external braking resistor, regenerative braking is not implemented in this module. This is in keeping with the philosophy, of restricting the development to our existing dies. Deceleration of the load is programmed to occur in a controlled manner, where the small amounts of energy concerned are dissipated in the motor windings.

Except in the case of a DC input, this configuration necessitates the floating of the negative rail of the rectifier bridge with respect to earth. This is due to the absence of an isolation transformer, which was not appropriate to the primary purpose of our design.

The earth connection is made to the exposed metalwork of the module (if applicable) and to the motor frame for safety reasons. The electronics ground of the module, of course, has to connect to the negative rail of the rectifier. As mentioned earlier, this necessitates isolation between the module electronics and any peripheral device used for communicating the control data. The optical link provides the most elegant solution.

In general, where a data connection is required, a larger drive would make use of a transformer within its power supplies, while the smaller drive would require careful isolation of the electronics from the operator and would need isolation for its comms link (opto-isolators) as well. The alternative method of floating the PC or other peripheral devices is not considered safe practice.

DC Link Capacitor

At the power levels associated with our module and the fact that this particular iteration did not concern itself with the optimal state of affairs with regards to machine (or line) harmonics, the size of this component could be reduced more than usual. In this embodiment it is an external component, housed in the junction box alongside the module.

Inverter Power Switching Devices

The inverter portion of the module is a conventional three-phase full-bridge consisting of MOSFET devices incorporating their default free-wheeling diodes or can be many different PSDs such as IGBTs, SCRS, MCTs, etc.

The ratings of the devices provide the design with ample headroom from both current and power dissipation points of view, although care still has to be taken with layout to keep the voltage spikes within the device SOA as the nominal input voltage levels to the module are approached.

The headroom available with respect to current capability and the fact that our module was not designed as a high performance device, allows us to ease off on the switching requirements, resulting in the following advantages:

dispense with the need for snubbers or voltage clamps for each switching device.
allow us to make use of the (non-ideal) built-in diode for free-wheeling purposes.
assist the layout constraints in reducing voltage spikes.

Control of the switching speeds with the gate resistors (R1 through R6) and setting minimum pulse widths and switching frequencies through the controller are used to effect this.

Selecting switching frequencies above the audible range (above 20 kHz) is still achievable, given the power devices selected.

Drivers and Protection

Although certain reservations were initially expressed regarding the output capability of the IR2132, with the decision to ease the drive requirements of the MOSFETs, this device became more attractive since it incorporated most of the functions of the driver section (drivers for all six switches, over current protection (global) and built-in dead-time between upper and lower switches within a given phase arm). Some of these functions can be generated by the controller circuitry.

The HIP2500, an alternative to the IR2132, has provision for the simultaneous shut down of all six switches in the event of a fault. Its drive capability is more than adequate for the MOSFETs chosen and it possesses under-voltage lock-out.

The following functions have to be generated by the controller circuitry in addition to the six drive signals provided to the three HIP2500 drivers.

over-current shutdown in the event of an overall inverter fault condition.
dead-time between the upper and lower switches within a given phase-arm.

The HIP2500's require 15V to power the chip (Vcc) and low -side switch driver, with the diode pumps comprising D7 through D9 and C3, C6 and C9, providing the floating drive supply for the upper switches. The logic supply (Vdd) is common to that of the controller (5V).

The Controller

This part of the module is defined by the micro-controller candidate available in bare die form. The inputs and resulting outputs required of this section of the module are shown on the schematic.

The more advanced variations on the 8051 theme allow the implementation of the required functions with minimal extra chips. An important consideration, given the difficulty of supply.

The IrDA infrared data link is mounted on the substrate, not far from the micro-controller.

Power Supplies

Once again, as a result of the restrictions placed on bare die supply, the power supplies (15V and 5v) for the module electronics are built using conventional packaged devices and so reside outside the module, alongside it the junction box. Simple resistive dividers deriving the power from the DC link would not be practical given the some hundreds of milli-amps required by the module electronics.

Figure 9:
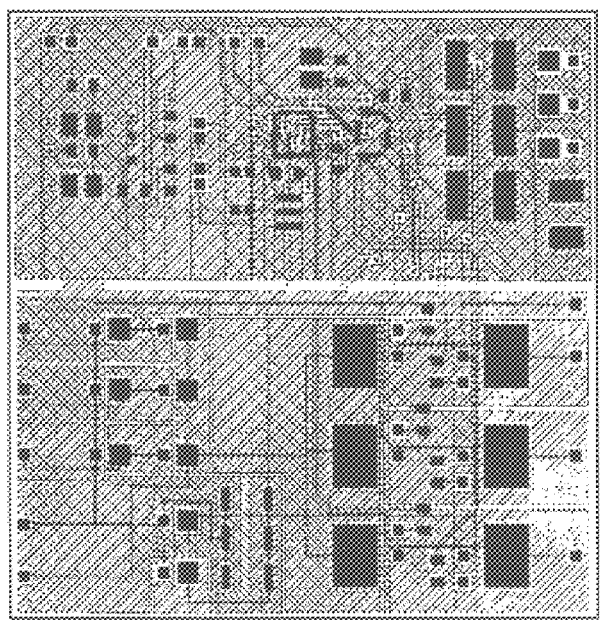
FIG. 9 is a top view representation of an MCPM smart motor drive module in accordance with one embodiment of the present invention.
Figure 9A:
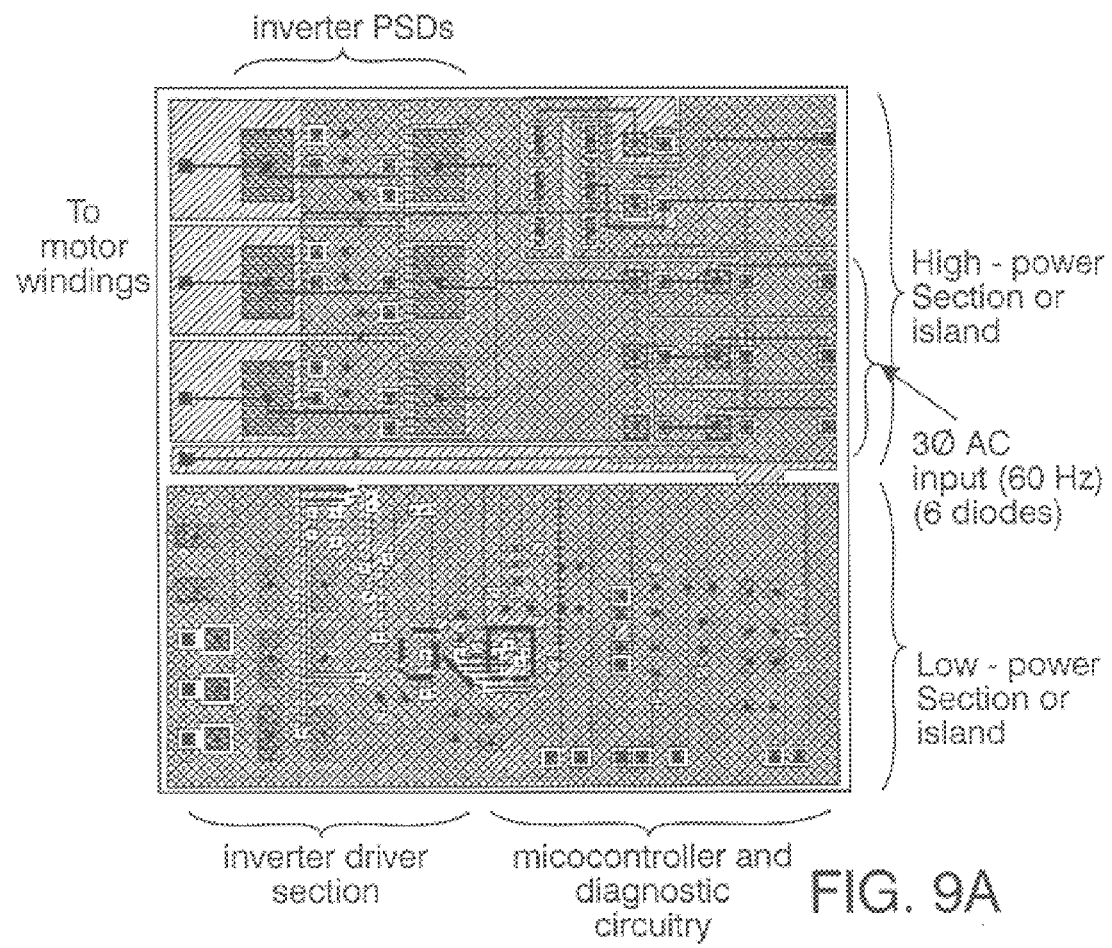

Note too, the decoupling capacitors shown in the schematic (FIGS. 8 and 9). Obviously, they must be placed as close as possible to their respective chips in order to provide effective decoupling.

Revised Modules

The surface mount (sm) version:
This first module forms the proving ground for the design and provide the bench marks for evaluating MCPM units. The first iteration of the sm module with the final sm prototype due end June 1996. Conventional PCB technology using sm versions of the chosen semiconductor candidates were used in its fabrication. Attention to layout and construction techniques invoked by power converter design are worked into the module.

The MCPM version:
Although layout and fabrication considerations dictate much of the design, the final fabrication of the MCPM is dictated by the hardware of the sm version. The fabrication of the MCPM and its spares are carried out in parallel with the development of the system software. (A simple algorithm is initially used to test the functionality of the hardware.)

The same simple software is used to test the first iteration of the MCPM. Two to three modules should be fabricated at first with the remainder of the components withheld for the final fabrication, once all the bugs have been resolved. The final version of the particular MCPM should then be constructed.

Production Example

Task 1: Specify Micro-controller
Implementation: Obtain commitment from Intel for the supply of a set of 8051 series dies. The more advanced the variation, the better. In order of preference, 87C51GB, 87C51FA, FB or FC, 8752 and 8751. Should nothing be forthcoming go for a packaged device in order to make end time-scales. If you go the packaged device route, the quickest could be the PIC16C74. You would require one device per module.

Deliverable: A definite nomination and delivery date for the chosen micro-controller in the case of bare dies. A decision to go for a packaged device (the PIC16C74) if the bare dies are not available.

Task 2: The Next Iteration of the Schematic, With Controller Section Complete.
Implementation: With the candidate for micro-controller firmed up, the design can be completed and the schematic updated to reflect the complete module design. The schematic can then be transmitted as an attachment via e-mail. The parts-list will also be generated at this time.

Deliverable: A complete Smart Motor schematic diagram.
Task 3: Order and Ship Components for Surface Mount Prototype.
Implementation: With the shipment of the next schematic, the parts-list with vendors will be attached The components can then be ordered and shipped for the fabrication of the surface mount prototype.

Deliverable: A package of components for the construction of the sm prototype.

Task 4: Construct Surface Mount Prototype and Test Functionality With Simple Software.

Implementation: The surface mount version can be constructed on conventional PCB. Simple software can be written and installed to test the functionality of the entire module hardware. This task will provide the baselines for the performance of each functional block of the module. The results of the tests will form important inputs into the process of fabricating the MCPM.

Deliverable: A working sm prototype of the module (hardware complete) with findings important to the fabrication of the MCPM.

Task 5: Initial Fabrication of MCPM.

Implementation: Although preparation for the fabrication of the MCPM should already be underway, final fabrication using all the purchased dies needs to await the outcome of Tasks 4 and 6. Perhaps two or three modules could be started on completion of Task 2, in particular, the front-end rectifier, inverter and driver parts, as these are unlikely to change much. Only after the completion of Task 6 would it be safe to fabricate all the modules in their entirety using the remainder of the dies.

Deliverable: First two or three modules containing the power components and their drivers.

Task 6: Final Testing of the sm Version.

Implementation: This task completes the hardware iterations of the sm version. It also includes the writing of more advanced software to generate the PWM and drive a motor. In fact, all that should remain software-wise will be the bells and whistles associated with the user-module communications and operator dialogue.

Deliverable: Working sm module operating a motor as part of a variable-speed drive. Report on module performance and bench-marks for the MCPM.

Task 7: Testing of the First MCPMs.

Implementation: This task consists of the testing of the first MCPM devices. At this stage, presumably, the power parts. External signal generators would provide the inputs to the drivers for testing the inverter part of the module, phase arm by phase arm. The first indications of successful fabrication of the MCPM arise out of this task.

Deliverable: Test results of the first MCPMs.

Task 8: The Next Iteration and Fabrication of the Final MCPMs.

Implementation: Based on the results of Tasks 4 through 7, the final form of the MCPM is fabricated.

Deliverable: The final MCPM modules.

Task 9: Testing the MCPM.

Implementation: This task involves the programming of the MCPMs with the final program and testing the modules as part of the Smart Motor concept.

Deliverable: Set of MCPM modules and a Smart Motor set-up.

Task 10: Presentation of the Smart Motor or Final Product.

Implementation: A gala presentation of the MCPM Smart Motor drive to the company, industry or other interested parties.

Deliverable: The final product.

FIG. 9 is a transparent top view of one possible layout of the MCPM using MCM structures. The top section, or high-power island, contains the designer's PSD of choice (e.g., MOSFETs, IGBTs, SCRs, etc.), chip and/or embedded resistors for current sensing and other functions and chip diodes, and could be embedded, for rectification and other functions. The bottom section or low-power island contains the inverter driver circuits which turn the inverter PSDs on and off, and the microcontroller and diagnostic circuitry which is the main interface to the outside world. The microcontroller, digital signal processor, programmable logic controller, etc. should be either unidirectional or bidirectional based on the desired performance criteria. The low-power island may contain embedded resistors, inductors, transformers (any passive device) and/or capacitors to maximize surface area on the top layer of the MCPM.

Figure 10:
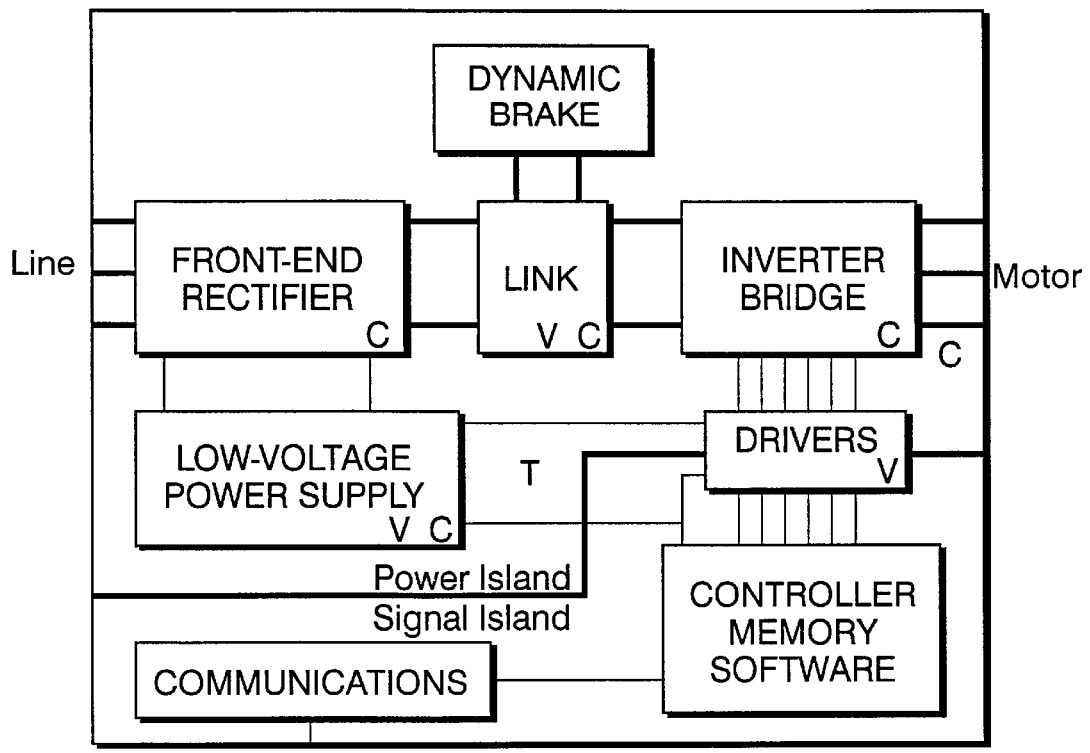
FIG. 10 is a schematic block diagram of an MCPM inverter module.

FIG. 10 is the generic block diagram for the MCPM. Depending upon the control algorithm transmitted to the controller memory software block via the communications block, the MCPM can be configured to operate in the following manner: "open-loop" volts per hertz electric motor drive, "closed-loop" field-oriented or vector control electric motor drive, an active power filter for annihilating voltage and current harmonic components in utility electric power system, uninterruptible power supply (single or three phase), among many others.

Each of FIGS. 11–20 shows or explains the construction or operation of an invention for the conversion of electrical power from one form to another. The general idea is to allow for the conversion of one power source to another through the use of a single substrate controller. The basic drawing (FIG. 13 and 10 also) shows an AC to AC converter, however, we will explain them in the order of AC to DC, DC to AC, AC to AC, and DC to DC respectively in the following explanations.

The items in FIGS. 11–14 of the drawings include one or more of the following: Input/Line, such as 3 'phase , 208 V, 60 Hz; Front End Rectifier, such as a passive or active rectifier; Link; Dynamic Brake; Inverter Bridge; Motor/Output, such as variable magnitude variable frequency; Controller/Memory/Software; Communications; Drivers; and/or Low voltage Power Supply.

Figure 11:
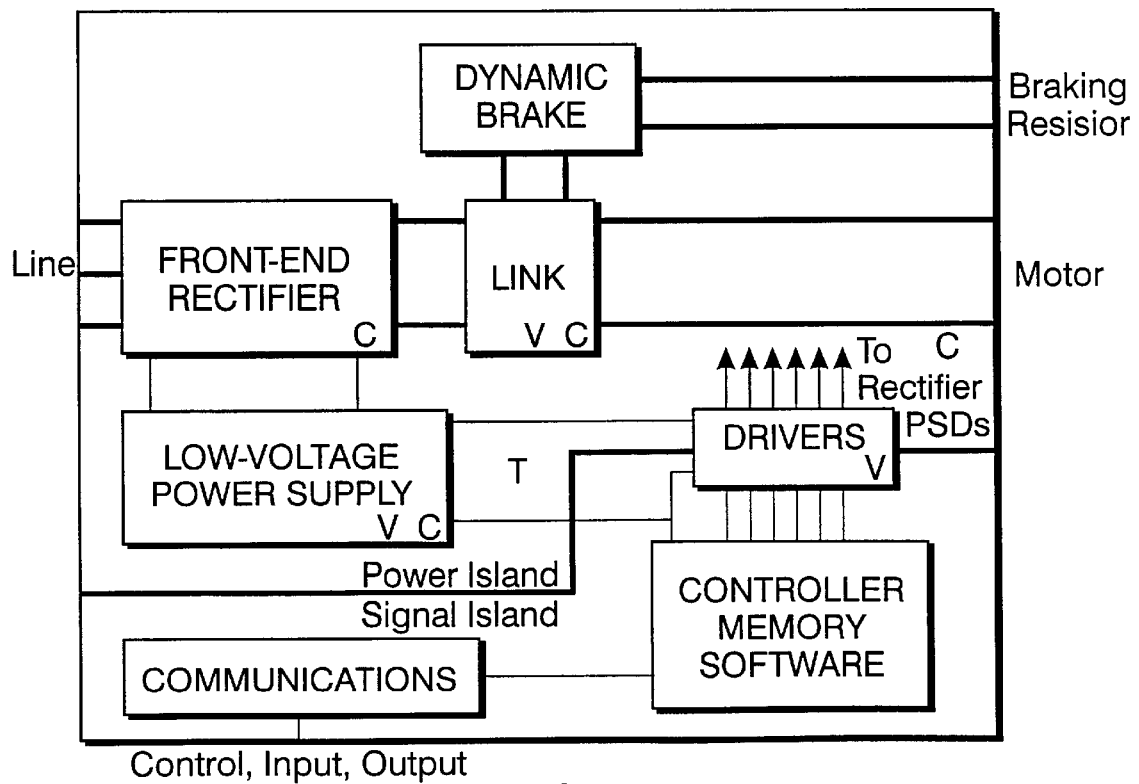
FIG. 11 is a schematic block diagram of an ac to dc converter.

FIG. 11 shows an AC to DC Converter—Alternating Current to Direct Current Converter. This single chip or substrate circuit or device converts an AC power source to a DC power output. The chip works in the general manner described as follows:

A power source of an alternating current type is connected to the Input of the chip. This AC power source is then converted through the Rectifier to create a mainly DC power output. The Rectifier receives its commands from the Controller if it has controllable PSDs versus diodes. The Controller may receive input directly from the Input, the Rectifier, the Output, or the Communication blocks. The Communication provides a means for obtaining signal(s) from outside of the chip. Through this method of controlling the Rectifier, any Output voltage or Output current can be maintained for the Output up to that allowed by the ratings of the components.

An optional Link can be connected to the output side of the Rectifier. This Link, functioning as a filter, can be used to smooth the power output signal.

An optional Brake can be connected in the same general manner as the Link in order to provide a different, non-powered method of controlling the output.

An optional external element can be connected to the Brake to help control the Output signal.

Figure 12:
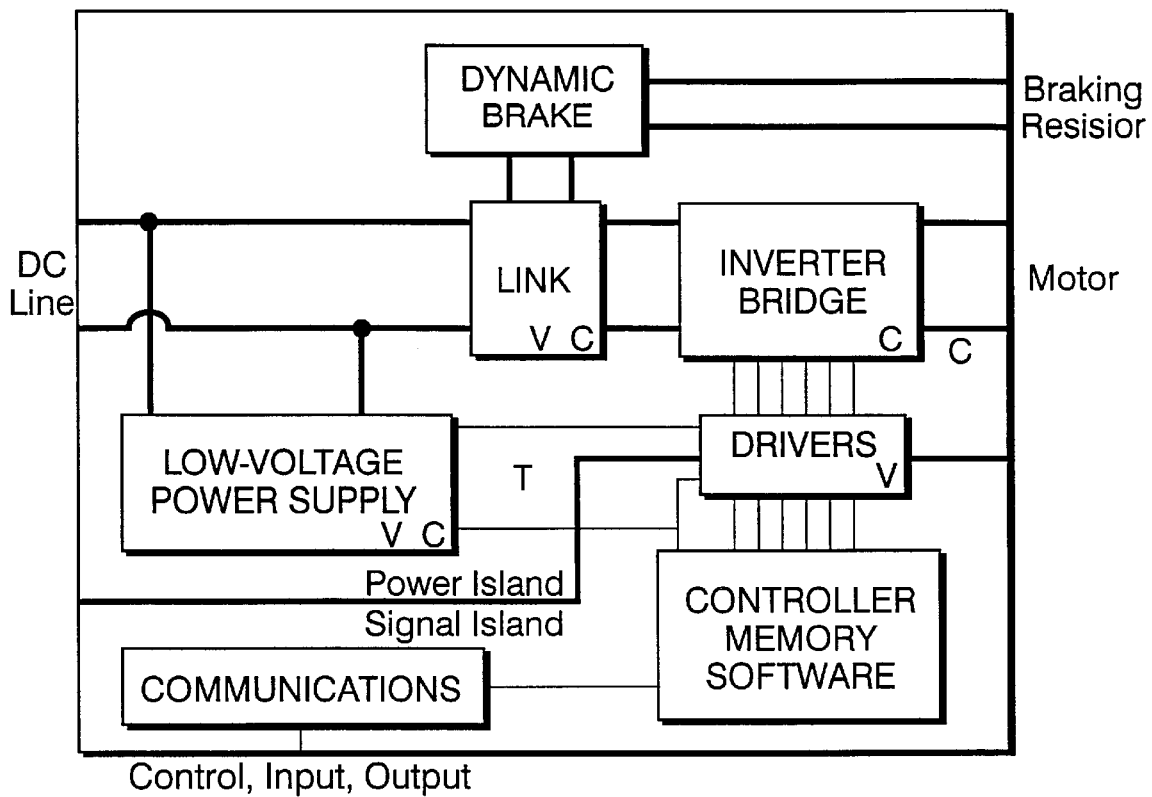
FIG. 12 is a schematic block diagram of a dc to ac converter.

FIG. 12 shows a DC to AC Converter—Direct Current to Alternating Current Converter. This single chip or substrate circuit or device converts a DC power source to an AC power supply. The chip works in the general manner described as follows:

A power source of a direct current type is connected to the Input of the chip. The input of the chip is connected through an optional Link (discussed below) to the Inverter. The Inverter is controlled by signals from the Controller. The Controller may receive input directly from the Input, the Inverter, the Output, or the Communication blocks. The Communication provides a means for obtaining signals from outside of the chip. Through this method of controlling the Inverter, any Output voltage, Output frequency, or Output current can be maintained for the Output up to that allowed by the ratings of the components.

An optional Link can be connected between the external Input and the Inverter. This Link can be used to smooth the power input signal.

An optional Brake can be connected in the same general manner as the Link in order to provide a different, non-powered method of controlling the output.

An optional external element can be connected to the Brake to also control the Output signal.

Figure 13:
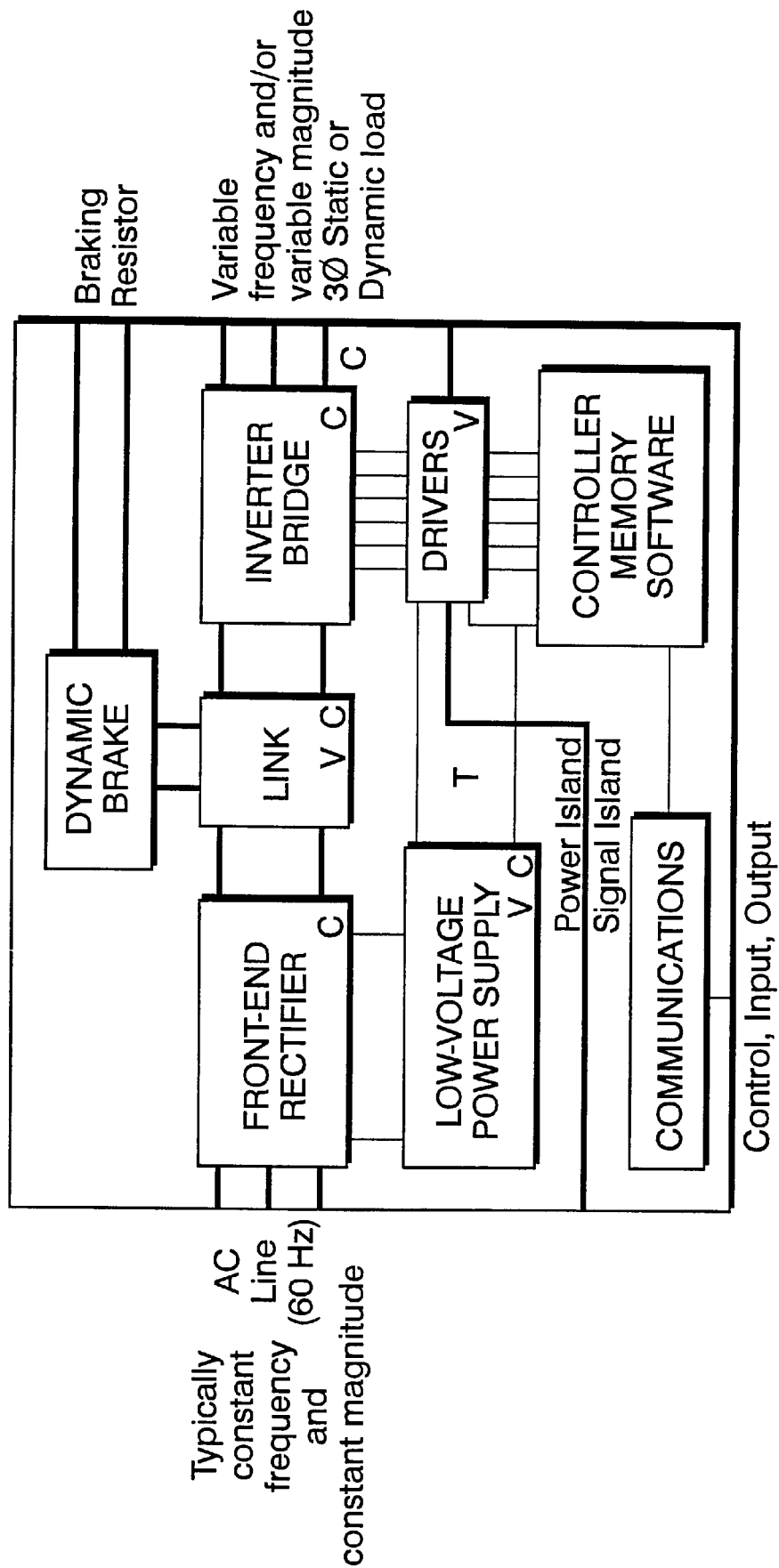
FIG. 13 is a schematic block diagram of an ac to ac converter.

FIG. 13 shows an AC to AC Converter—Alternating Current to Alternating Current Converter. This single chip or substrate circuit or device converts an AC power source to a different AC power output. The chip works in the general manner described as follows:

Using the AC to DC Converter system described in FIG. 11 and connecting its Output to the Input of the DC to AC system described in FIG. 12, the general operating principle of FIG. 13 is created.

Repetitive items such as the Controller or Communications can be combined into one unit to perform all of the necessary functions, or can be left as individual units with separate operations.

FIGS. 12 and 11 can be combined to form a DC to DC Converter—Direct Current to Direct Current Converter. This single chip or substrate circuit or device converts a DC power source to a different DC power output The chip works in the general manner described as follows:

Using the DC to AC Converter system described in FIG. 12, and connecting its Output to the Input of the AC to DC system described in FIG. 11, the general operating principle of a DC to DC converter is created.

Repetitive items such as the Controller or Communications can be combined into one unit to perform all of the necessary functions, or can be left as individual units with separate operations.

Figure 14:
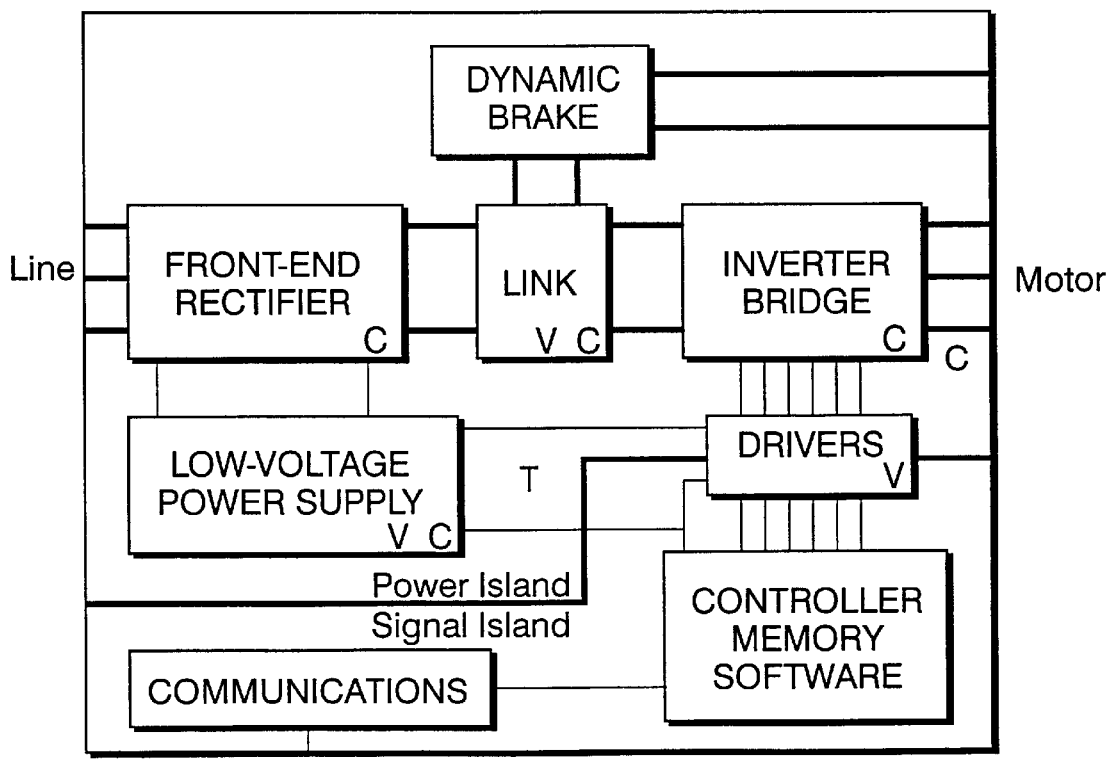
FIG. 14 is a schematic block diagram showing the converter of FIG. 13 with the addition of a low voltage power supply.

FIG. 14 shows the same ideas as put forth in FIGS. 11, 12 and 13. Note that the low-voltage power supply could be left off the MCPM as shown in FIG. 14 and obtained via an independent power supply.

Note also that FIG. 14 shows the separation of the power and signal islands inside of the chip.

University of Arkansas Multichip Power Module General Production Process

The starting substrate can be, silicon or metals such as aluminum or metal composites, or a micromachined thermal substrate. An insulating layer, which can be an organic such as polymer, thermal conducting polymer, or liquid crystal polymer, or inorganic such as an insulating ceramic, is deposited onto the substrate. A layer of conductor, its thickness and width sized according to the current carrying requirements, is then deposited or electroplated to form the conductors for the power dies. A second insulating layer is then deposited and openings are provided for connection to the low-power circuitries which will be seated on a portion of the module away from the power dies. Openings will be provided where the power dies will be mounted. The conductor layer for the low-power circuitries is then deposited and patterned and etched. For a high-density low-power circuitry, another conductor layer can be deposited after the third insulating layer. In this way, the low-power circuitries are away from the heat generating power dies. Passive elements, such as resistors and capacitors, can also be embedded into the low-power circuitries. The embedded resistors are made of sputtering chrome silicide or nichrome onto the second or third insulating layer. Similarly, small-valued capacitors can be embedded by sputtering tantalum oxide onto the second or third insulating layer. The capacitor dielectrics can also be formed by anodizing sputtered aluminum or tantalum. High-current capacitors can be formed by lead lanthanum zicronia titanate (PLZT based materials).

After fabrication of the MCPM substrate, the individual components are attached to the substrate. The power dies are attached directly to the first-level conductor. The substrate of the power dies are connected through the electrically conducting die attach. The other electrical terminals of the power dies are then wire-bonded to the patterned thick conductors. In this way, heat can be easily dissipated to the underlying heat conducting substrate. The circuit components for the control circuits are then attached and wire bonded (or flip-chip bonded, if desired) to the low-power circuit part of the MCPM substrate. The complete MCPM module can consist of embedded thin or thick film resistors, embedded capacitors, or embedded magnetic components as well as power dies, intelligent-controller, and other circuit components.

Figure 15A:
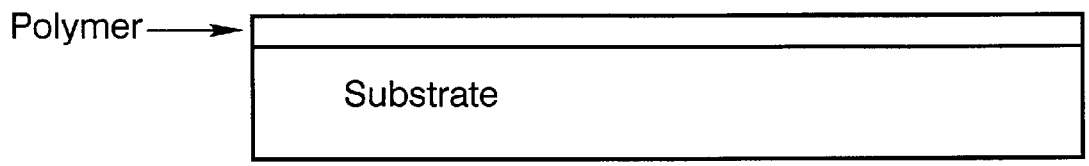
FIG. 15 is a schematic cross-sectional representation of the sequence of the basic method to create a transformer within a multiple layer chip or device in accordance with the present invention.
Figure 15B:
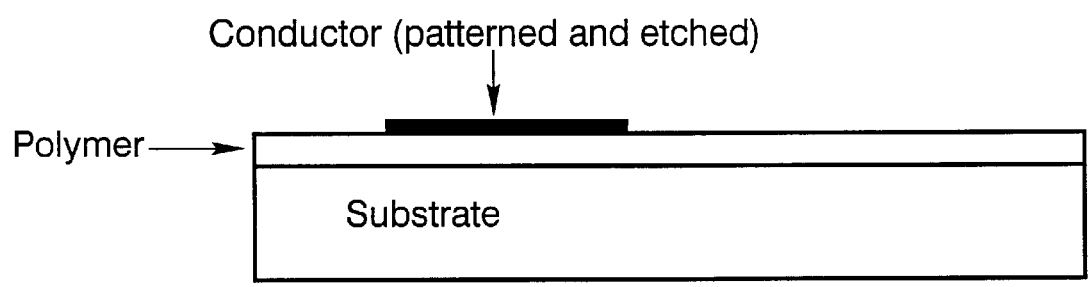
Figure 15C:
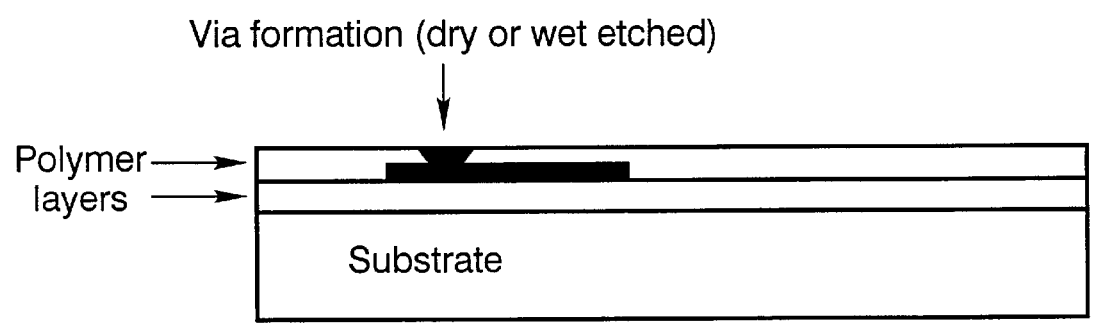
Figure 15D:
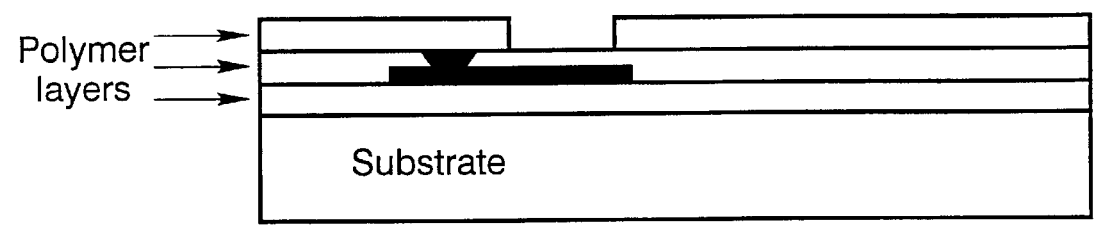
Figure 15E:
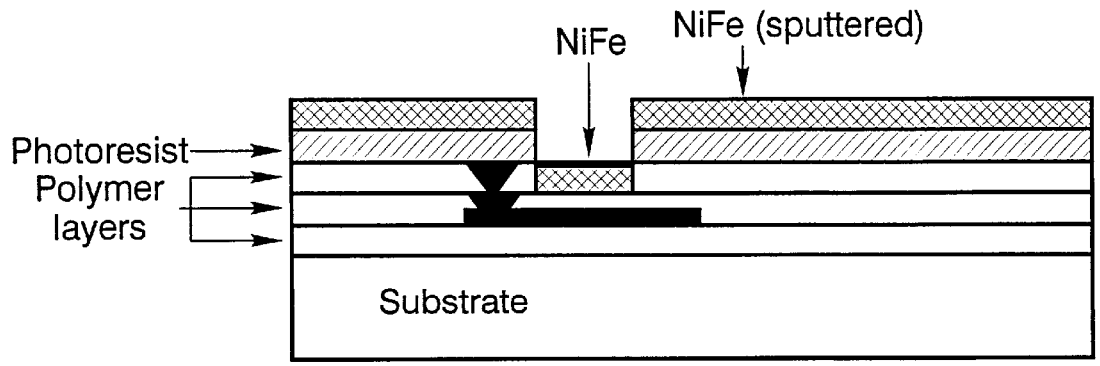
Figure 15F:
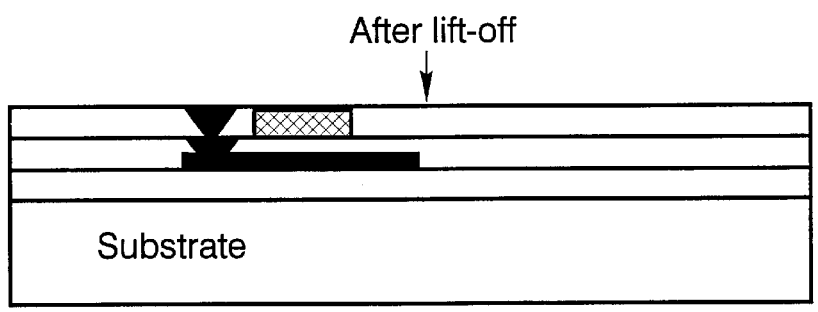
Figure 15G:
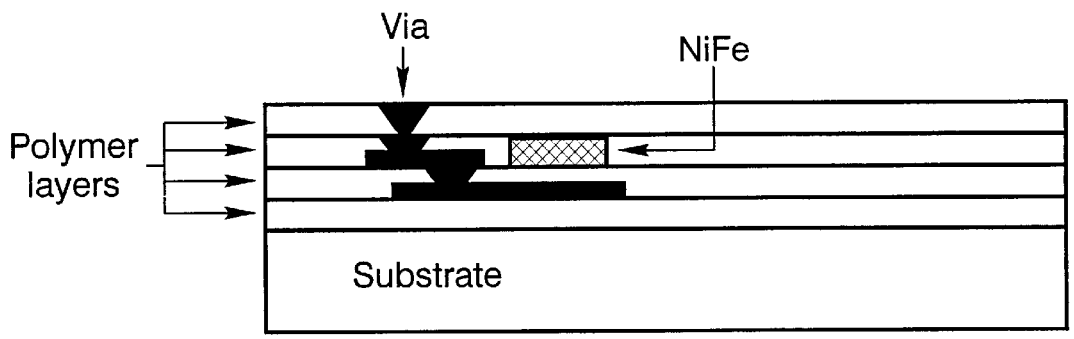
Figure 15H:
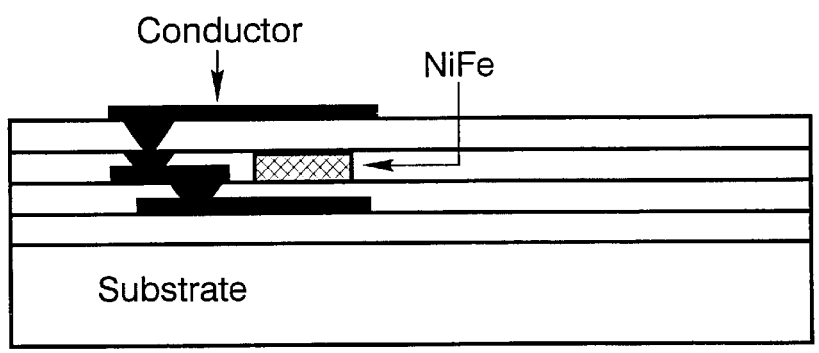
Figure 20:
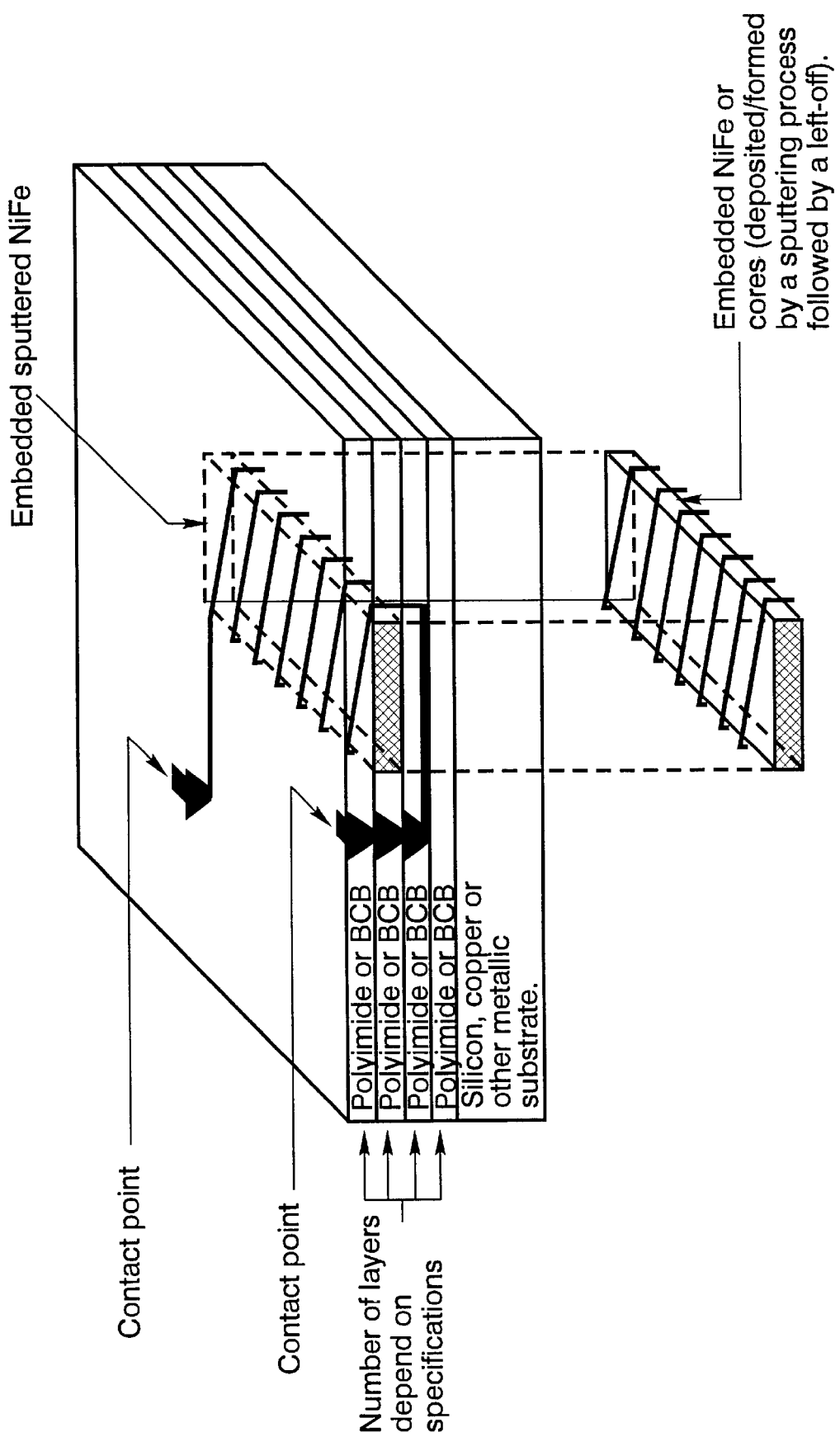
FIG. 20 is a schematic perspective view illustration of an MCPM embedded inductor/transformer in accordance with still yet another embodiment of the present invention.

Example University of Arkansas Embedded Magnetic Process for Multichip Power Modules The starting substrate can be either silicon or metals such as aluminum or metal composite. An insulating layer, which can be a polymer, liquid crystal polymer, or ceramic, is deposited onto the substrate [FIG. 15A]. Alternatively, an insulated metal substrate (IMS) can be used. The first layer of conductor is deposited by sputtering, evaporation or electroplating, patterned and etched to form a part of the magnetic winding [FIG. 15B]. Note that in the case of electroplated conductor, a seed layer is required. The seed layer is first patterned and etched, following by electroplating of the metallic conductor. A second insulating layer, which can be either organic such as a polymer or inorganic such as a ceramic, is then deposited, patterned, and etched to provide openings or vias for connection to the subsequent upper magnetic winding conductor layers [FIG. 15C]. A third insulating layer (organic or inorganic) is then deposited and openings are provided for the deposition of the magnetic core material [FIG. 15D]. The magnetic core material, such as NiFe or Permalloy or other known magnetic core materials, is sputtered deposited [FIG. 15E] or electroplated. For the sputtered magnetic core material, a lift-off process can be used to selectively leave the magnetic core material to form the magnetic components [FIG. 15F]. A fourth insulating layer (organic or inorganic) is then deposited and openings are provided for connecting the bottom-layer windings to the upper layer windings [FIG. 15G]. The upper-layer winding conductor is then deposited or electroplated to form a part of the winding as shown in FIG. 15H. FIG. 20 shows the structure of an inductor using the MCPM embedded inductor/transformer process. The embedded magnetic process can be made as part of a normal process for the MCPM process.

In accordance with another Embedded,Magnetic Process, an eight sequence basic method is used to create embedded magnets within a multiple layered chip or on a single substrate. This method can be used to imbed a layer of nickel-iron or other alloy to create a linking or coupling effect like that in a coil wound transformer.

Starting with a substrate and polymer, a layer of conductor is added. Additional layers of polymers and conductor are added in order to begin creating an electrical path upward through the layers and insulating layer between the conductor and the alloy that is to be added. Then, there is created a polymer layer with an opening for insertion of nickel-iron or other suitable alloy and an insulating cover is temporarily made over the upward electrical connection. Then alloy is added to the proper location. Next, alloy and the temporary insulator is removed from unnecessary areas. Additional layers are added that continue the insulation surrounding the alloy and the upward connection of the conductor. That the addition of additional conductors could then continue. Note that this allows for multiple layers of conductor and iron to continue indefinitely.

Figure 16:
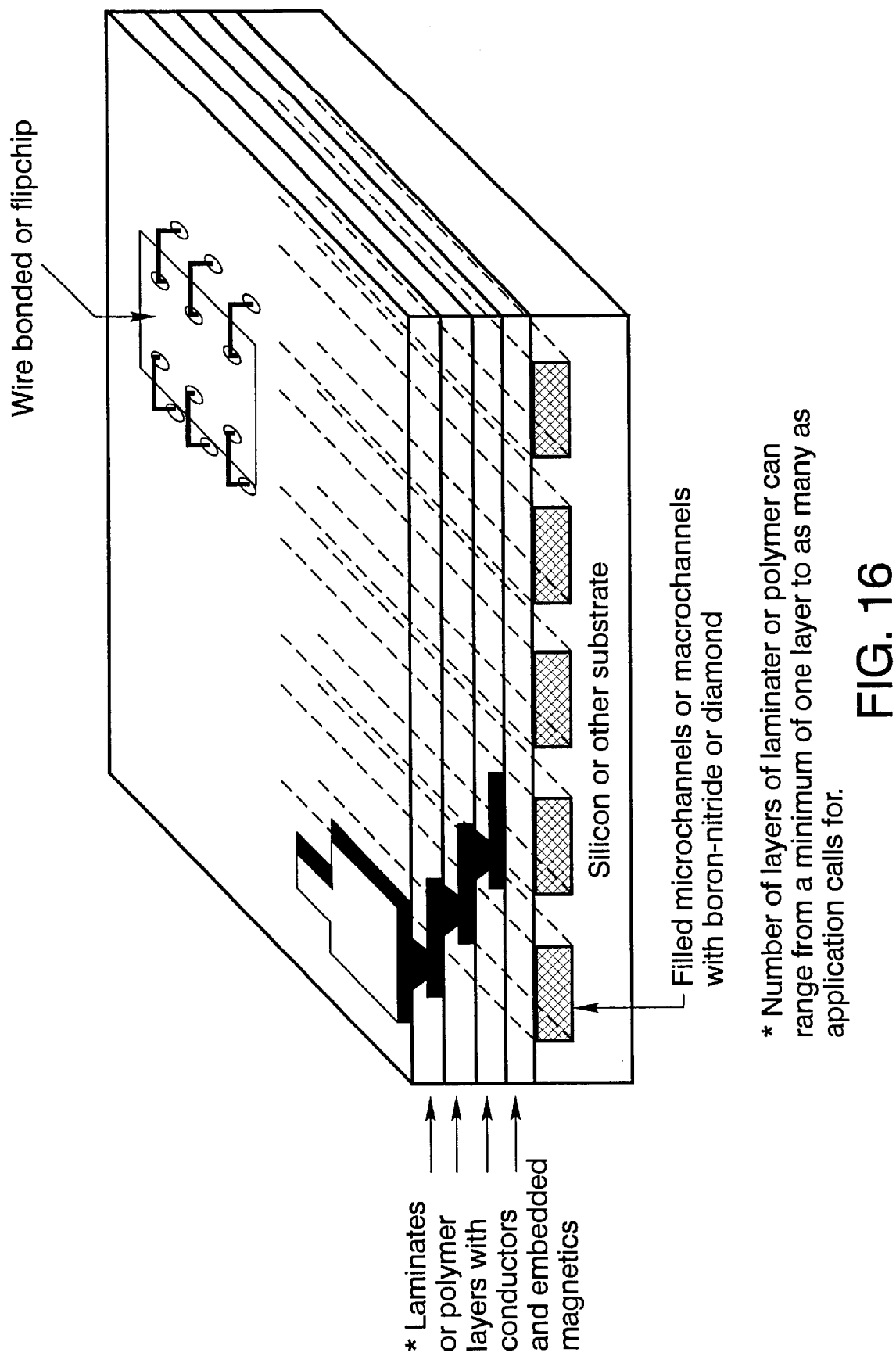
FIG. 16 is a schematic perspective view illustration of an MCPM thermal substrate.

FIG. 16 shows MCPM Thermal Substrates. This FIG. shows how channels of a thermally conductive material can be added within the chip or on the substrate to create a device and method for heat removal from the internal operations of the chip. Specifically shown are boron nitrade and diamond, which are two of the highest thermal conductors, but any such thermal conductor could be used based on design performance requirements.

FIGS. 17 and 18 show MCPM on Flexible Substrates. These FIGS. show devices and methods to create external connections on flexible substrates through the use of ball-grid array technology (FIG. 17) for the interconnect to other conductors or the use of an exposed conductor from with the flexible polymer layers containing embedded magnetics and/or passive components (FIG. 18). One can use flexible polymer layers or films when necessary to replace more rigid layers when specialized contours are needed based on the application. Note attaching KGD to the surface and embedding passive elements are possible.

Figure 19:
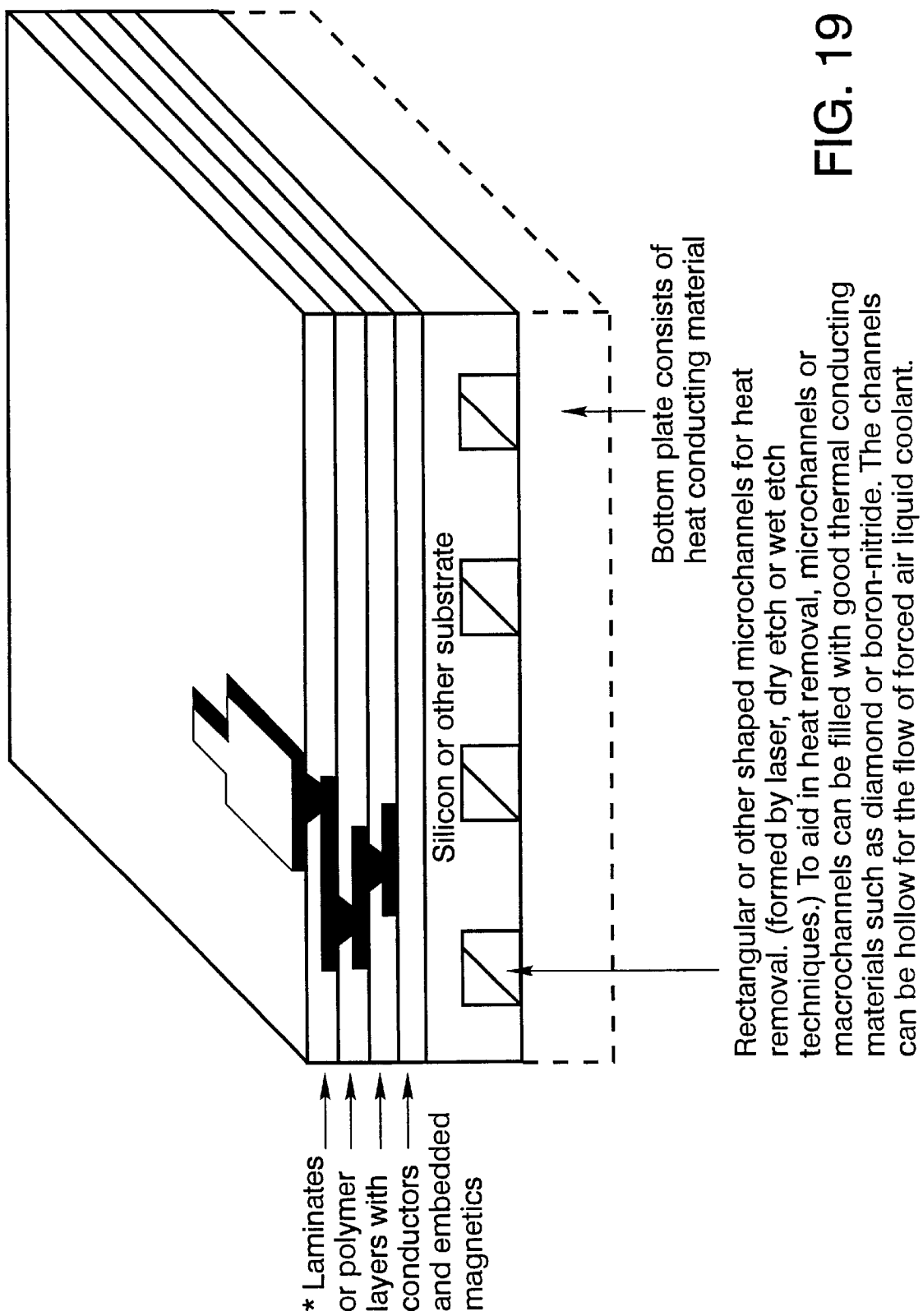
FIG. 19 is a schematic perspective view illustration of an MCPM thermal substrate in accordance with another embodiment of the present invention.

FIG. 19 shows MCPM Thermal Substrates. This FIG. shows how channels can be left open in order to enhance the flow of heat or heat removing medium from the inner portions of a multiple layer device. The openings may be either filled using good thermally conductive materials (e.g., diamond or boron nitride) or used for the flow of forced air or liquid cooling. The bottom plate will also be of a good thermally connective material.

University of Arkansas Micromachined Thermal Substrates FIGS. 16–19

The starting substrate for the micromachined thermal substrate can be either silicon or metal. Rectangular or other shaped microchannels are micromachined into the substrate using laser, dry etch or wet etch techniques as shown in FIGS. 16 and 19. The microchannels can be filled with high thermal conducting materials such as diamond, diamond-like carbon, or boron nitride. These microchannels can also be left hollow to allow for forced air or liquid cooling.

FIG. 20 shows MCPM Embedded Inductor/Transformer Process. This Figure shows the method explained in FIG. 15 of the creation of an inductor or transformer within the multiple layers of chip or on a single substrate. This further enhances the ideas of using a connecting pathway and insulated alloy in the creation of multiple layers within a chip. The Lower Form shows how the conductive material can be made to wrap around the insulated alloy to achieve the appropriate number of turns necessary in an application.

Features of the subject apparatus and methods include an integrated circuit assembly formed on a single substrate and capable of transforming and controlling AC power input to DC power output responsive to input signals and includes a power rectifier subcircuit of either the passive or active type, an energy-transferring link subcircuit which may be either capacitive or inductive, a controller subcircuit including low-power digital electronic circuits for controlling the power rectifier subcircuit and a communication subcircuit having an output received by the controller subcircuit and inputs for receiving signals from an external source.

Also, an integrated circuit assembly on a single substrate and capable of receiving direct current power and controlling it and transforming it to alternating current power in single phase or multiphase form having variable magnitude and/or variable frequency and includes on a single substrate a subcircuit in the form of a power inverter including thyristorp or other power semiconductor switching devices, a controller subcircuit with outputs controlling the switching devices of the power converter and including digital integrated circuitry, and a communication subcircuit with an output to the controller and with inputs for receiving communication signals from external sources.

Furthermore, an integrated circuit assembly on a single substrate and capable of receiving alternating current power and controlling it and transforming it to alternating current power in single phase or multiphase form having variable magnitude and/or variable frequency and includes on a single substrate a power rectifier subcircuit of either the passive or active type, an energy-transferring link subcircuit which may be either capacitive or inductive, a subcircuit in the form of a power inverter including thyristors or other power semiconductor switching devices, a controller subcircuit with outputs controlling the switching devices of the power converter and including digital integrated circuitry, and a communication subcircuit with an output to the controller and with inputs for receiving communication signals from external sources.

Figure 21:
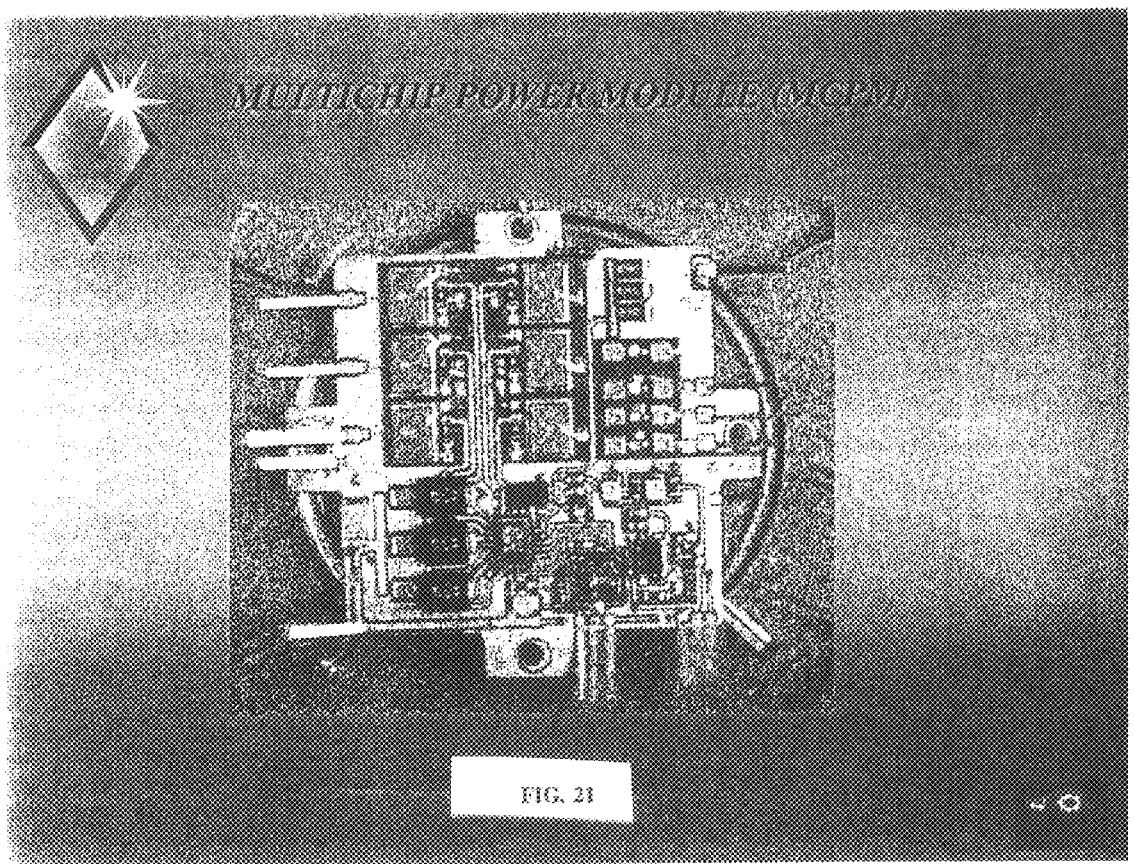
FIG. 21 is a color reproduction of the top view of an MCPM module prototype.
Figure 22:
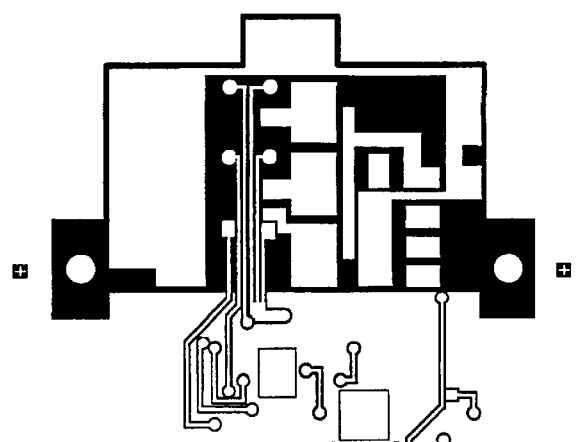
FIGS. 22–24 are respective layer representations of the prototype of FIG. 21.
Figure 23:
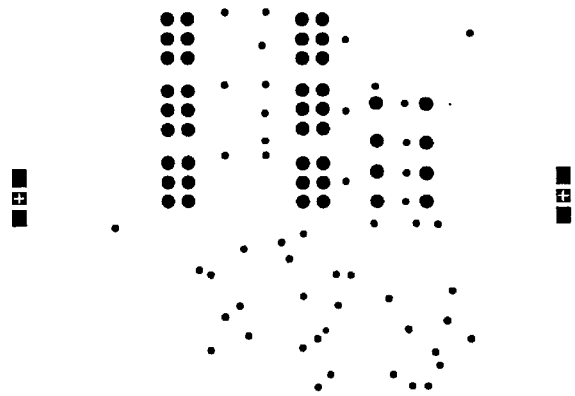
Figure 24:
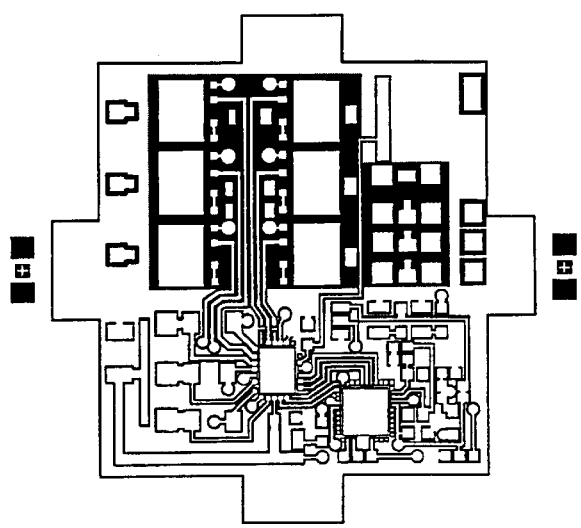

FIGS. 21–24 of the drawings relate to an exemplary prototype of the multi-chip power module (MCPM) for converting a conventional electric motor into a "smart motor". FIG. 21 is a color reproduction of the top view of the prototype. FIG. 22 is a representation of the first metal mask for the MCPM prototype of FIG. 21. FIG. 23 is an illustration of the second dielectric mask for the MCPM of FIG. 21. FIG. 24 is a representation of the third metal mask for the MCPM of FIG. 21.

It is to be understood that the examples in prototype described in the present application are exemplary of embodiments of the present invention and that other variations and modifications, for example, other components, circuits, layout are possible within the scope of the present invention.

Thus, it will be appreciated that as a result of the present invention, a highly effective method and apparatus for the conversion of electrical energy from one form to another, and/or its management through multichip module structures is provided by which the principal objective, among others, is completely fulfilled. It is contemplated, and will be apparent to those skilled in the art from the preceding description and accompanying drawings, the modifications and/or changes may be made in the illustrated embodiments without departure from the present invention. Accordingly, it is expressly intended that the foregoing description and accompanying drawings are illustrative of preferred embodiments only, not limiting, and that the true spirit and scope of the present invention be determined by reference to the appended claims.

What is claimed is:

1. A single substrate solid-state multichip power module or controller for converting a conventional three-phase induction motor into a stand-alone variable-speed drive, comprising:

on a single substrate a front-end rectifier;

a dynamic brake;

a link between the front-end rectifier and dynamic brake;

an inverter bridge;

a low voltage power supply;

drivers;

controller memory software;

communications subcircuits;

wherein said module integrates low-power control and high-power sections onto a single silicon substrate; and, wherein said module is an MCPM module constructed to fit into the space provided for cable entry into a motor or a modified junction box fixed in this position.

2. The power module as recited in claim 1, wherein external components including a dc-link capacitor and low-voltage power supply are also mounted within the junction box.

3. A single substrate solid-state multichip power module or controller for converting a conventional three-phase induction motor into a stand-alone variable-speed drive, comprising:

on a flexible single substrate a front-end rectifier;

a dynamic brake;

a link between the frontend rectifier and dynamic brake;

an inverter bridge;

a low voltage power supply;

drivers;

controller memory software;

communications subcircuits;

wherein said module integrates low-power control and high-power sections onto a single silicon substrate; and, wherein said module is an MCPM module constructed to fit into the space provided for cable entry into a motor or a modified junction box fixed in this position.

4. The power module as recited in claim 3, wherein external components including a dc-link capacitor and low-voltage power supply are also mounted within the junction box.

5. A single substrate solid-state multichip power module or controller for converting a conventional three-phase induction motor into a stand-alone variable-speed drive, comprising:

on a single flexible substrate a front-end rectifier;

a dynamic brake;

a link between the front-end rectifier and dynamic brake;

an inverter bridge;

a low voltage power supply;

drivers;

an isolation transformer;

controller memory software;

communications subcircuits;

wherein said module integrates low-power control and high-power sections onto a single silicon substrate; and, wherein said module is an MCPM module constructed to fit into the space provided for cable entry into a motor or a modified junction box fixed in this position.

6. The power module as recited in claim 5, wherein external components including a dc-link capacitor and low-voltage power supply are also mounted within the junction box.

* * * * *